United States Patent
Yamagata et al.

(10) Patent No.: US 6,787,374 B2
(45) Date of Patent: Sep. 7, 2004

(54) SEMICONDUCTOR DEVICE MANUFACTURING METHOD AND SEMICONDUCTOR DEVICE SORTING SYSTEM TO BE USED WITH THE SAME

(75) Inventors: Hisao Yamagata, Goshagawara (JP); Katsumi Oya, Moroyama (JP)

(73) Assignees: Hitachi, Ltd., Tokyo (JP); Hitachi Tobu Semiconductor, Ltd., Gunma (JP)

( * ) Notice: Subject to any disclaimer, the term of this patent is extended or adjusted under 35 U.S.C. 154(b) by 228 days.

(21) Appl. No.: 10/083,503

(22) Filed: Feb. 27, 2002

(65) Prior Publication Data

US 2002/0182759 A1 Dec. 5, 2002

(30) Foreign Application Priority Data

May 31, 2001 (JP) ........................................ 2001-163682

(51) Int. Cl.⁷ .............................................. H01L 21/66
(52) U.S. Cl. ............................................ 438/14; 438/15

(56) References Cited

U.S. PATENT DOCUMENTS 6,284,566 B1 * 9/2001 Lee et al. ................... 438/107
6,316,734 B1 * 11/2001 Yang ............................ 174/256
6,376,769 B1 * 4/2002 Chung ........................ 174/52.2
6,428,650 B1 * 8/2002 Chung ......................... 156/250
6,599,763 B1 * 7/2003 Reyes et al. ................... 438/14

FOREIGN PATENT DOCUMENTS

| JP | 58-121636 | 7/1983 |
| JP | 8-86833 | 4/1996 |
| JP | 9-64260 | 3/1997 |
| JP | 9-64261 | 3/1997 |

* cited by examiner

Primary Examiner—Olivia T Luk
(74) Attorney, Agent, or Firm—Miles & Stockbridge P.C.

(57) ABSTRACT

A sorting section can be supplied with parts from plurality of supply sources. A semiconductor device sorting system is provided with a sorting section for sorting good transistors by means of an electric performance test thereof and supply sections adapted to separate the transistor parts that are collectively supplied in a complex into transistors and supply the separated transistors to the sorting section. An appropriate one of the supply sections can be selected corresponding to the supply form of the transistor parts to be separated. A selected supply section can be switched to another depending on the supply form of the transistor parts.

27 Claims, 33 Drawing Sheets

SEMICONDUCTOR DEVICE MANUFACTURING METHOD AND SEMICONDUCTOR DEVICE SORTING SYSTEM TO BE USED WITH THE SAME

BACKGROUND OF THE INVENTION

1. Field of the Invention

This invention generally relates to the technology of manufacturing semiconductor devices and, more particularly, it relates to a technique that can be effectively applied to the entire sequence of operations of a system for sorting semiconductor devices such as transistor diodes.

2. Related Background Art

Known automatic inspection apparatuses for inspecting semiconductor elements include one disclosed in Japanese Patent Application Laid-Open Publication No. 8-86833. The cited patent document describes an automatic inspection apparatus composed of a disc-shaped rotary inspection disk provided along the periphery thereof with slits, each of which is to receive an element to be inspected, and a feeder for feeding the slits of the rotary inspection disk with elements to be inspected sequentially on a one by one basis. The inspection disk containing elements to be inspected that are supplied from the feeder in the respective slits thereof is caused to make a full turn, during which the elements are inspected for their respective performances and then sorted and collected appropriately. In this way, the semiconductor elements are tested for their respective performances and good ones and defective ones are sorted automatically and efficiently.

The feeder of the automatic inspection apparatus disclosed in Japanese Patent Application Laid-Open Publication No. 8-86833 is formed by combining a bowl parts feeder and a linear parts feeder that are arranged in series. The elements to be inspected that are randomly contained in the bowl parts feeder are aligned in the linear parts feeder, and then, they are fed to the slits of the inspection disk on a one by one basis.

The parts feeding system using a bowl parts feeder has a problem as follows. That is, if the inspected parts such as elements to be inspected and semiconductor devices are made small in size, the handling thereof becomes very difficult, resulting in the decreased workability.

Additionally, as parts slides on the feeder, the marks such as product numbers applied to the surfaces of the sealed elements of the respective parts are erased by the friction between the sealed elements and the feeder. Also, the leads serving as external terminals of the parts are deformed as they contact with the inner peripheral surface of the feeder.

Still additionally, it takes considerably long time to feed the last several tens of the parts contained collectively in the bowl parts feeder. In other words, the operation of the bowl parts feeder is a time consuming one.

Still additionally, the bowl parts feeder is adapted to receive parts that are normally not separated from each other but connected to each other. However, different groups of connected parts may be supplied in different respective forms in some cases. Thus, when the connected parts are sorted in the sorting section, a single sorting system (sorting apparatus) may not be able to cope with all expected types of parts, in particular, when a type of parts is switched to another.

Furthermore, when a plurality of sorting systems are introduced to cope with such switches of a type of products, the cost of the sorting step inevitably rises. Additionally, such sorting systems require a large space. Therefore, the use of a plurality of sorting systems reduces the efficiency in terms of both cost and space.

BRIEF SUMMARY OF THE INVENTION

In view of the above identified circumstances, it is therefore an object of the present invention to provide a semiconductor device manufacturing method that makes it possible to supply parts to the sorting section for sorting parts from a plurality of supply sources of different types.

Another object of the present invention is to provide a semiconductor device manufacturing method that can increase the throughput of the sorting process.

Still another object of the present invention is to provide a semiconductor device manufacturing method that can reduce the manufacturing cost in the sorting process.

Still another object of the present invention is to provide a semiconductor device sorting system that can increase the throughput of the sorting process.

A further object of the present invention is to provide a semiconductor device sorting system that is space-saving.

The above and other objects and the novel features of the present invention will become clear from the following description and the accompanying drawings of the specification.

Now, the present invention disclosed in this application will be briefly described below.

According to the present invention, there is provided a semiconductor device manufacturing method including a step of preparing complexes, each having a plurality of sealed elements having a semiconductor pellet, and a step of providing a plurality of supply sources corresponding to different types of semiconductor devices and sequentially processing the complexes supplied from any selected one of the plurality of supply sources.

According to the present invention, there is provided a sorting system composed of a supply section having a cutting metal die for collectively cutting a given number of sealed elements having respective semiconductor pellets from a tape-shaped frame carrying the sealed elements and a sorting section for examining the performance of each of the semiconductor devices separated by the supply section and sorting them.

According to the present invention, there are provided a semiconductor device manufacturing method and a semiconductor device sorting system as listed below.

1. A semiconductor device manufacturing method including:
   (a) a step of preparing a tape-shaped frame of a complex having a plurality of sealed elements having a semiconductor pellet and a link member for linking them, the plurality of sealed elements being arranged consecutively at predetermined regular intervals;
   (b) a step of placing a reel carrying the tape-shaped frame wound around it in a supply section, supplying the tape-shaped frame from the reel and subsequently separating the sealed elements from each other in the supply section;
   (c) a step of sucking and holding a plurality of separated semiconductor devices by means of a robot hand section, arranging them linearly on a parts feeder in parallel to the same, stopping the suction by the robot hand section and at the same time separating the semiconductor devices from the robot hand section by blocking the front end of the robot hand section by means of a shutter section, aligning them on the linear parts feeder, and subsequently, individually supplying the semiconductor devices arranged in an aligned state to a sorting section by means of the parts feeder; and (d) a step of examining the performance of each of the semiconductor devices and sorting them in the sorting section.

2. A semiconductor device sorting system including:

(a) a supply section provided with a cutting metal die for collectively cutting and separating a given number of sealed elements arranged in a matrix form from a tape-shaped frame of a complex having a plurality of sealed elements having a semiconductor pellet and a link member for linking them;

(b) a sorting section for examining the performance of each of the separated semiconductor devices, sorting them and taping the products determined to be good by the sorting;

(c) a linear parts feeder for individually supplying the semiconductor devices separated by the supply section and arranged in an aligned state to the sorting section;

(d) a separated products carrier provided with recesses for receiving respective semiconductor devices separated by the cutting metal die, the recesses being arranged in a plurality of rows and a plurality of columns and adapted to move them near the parts feeder; and (e) a robot hand section for sucking and holding semiconductor devices received in the recesses of the separated products carrier and arranging a plurality of semiconductor devices linearly on the linear parts feeder for delivery.

DETAILED DESCRIPTION OF THE INVENTION

Now, the present invention will be described in detail by referring to the accompanying drawings that illustrate preferred embodiments of the present invention.

While the present invention is described below in terms of separate embodiments and their individual sections for the purpose of convenience, they are closely correlated and any of them may be realized by modifying one or more than one of its counterparts and hence, unless explicitly indicated otherwise, its description may be applicable and/or complementary to the description of others.

In the embodiments described below, the present invention will be described in a plurality of sections or embodiments when required as a matter of convenience. However, these sections or embodiments are not irrelevant to each other unless otherwise stated, and the one relates to the entire or apart of the other as a modification example, details, or a supplementary explanation thereof.

Also, in the embodiments described below, when referring to the number of an element (including number of pieces, values, amount, range, or the like), the number of the element is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, the positional relation thereof, and the like are mentioned, the substantially approximate and similar shapes and the like are included therein unless otherwise stated or except the case where it can be conceived that they are apparently excluded in principle. This condition is also applicable to the numerical value and the range described above.

Also, components having the same functions are denoted by the same reference symbols throughout the drawings for describing the embodiment and the repetitive description thereof will be omitted.

(First Embodiment)

Figure 1:
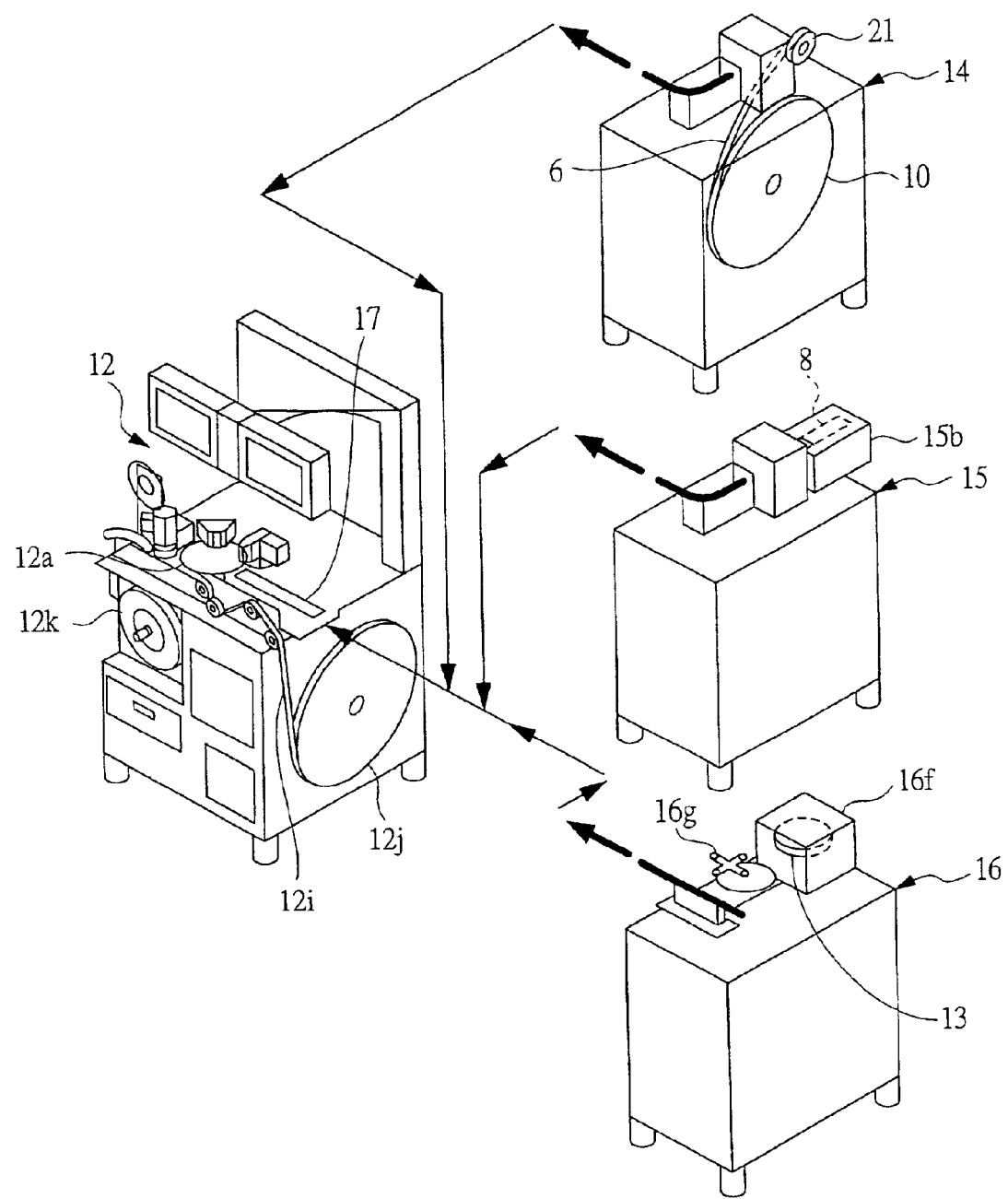
FIG. 1 is a schematic exterior perspective view illustrating an example of three types of semiconductor device sorting systems used in a semiconductor device manufacturing method according to the present invention.
Figure 2:
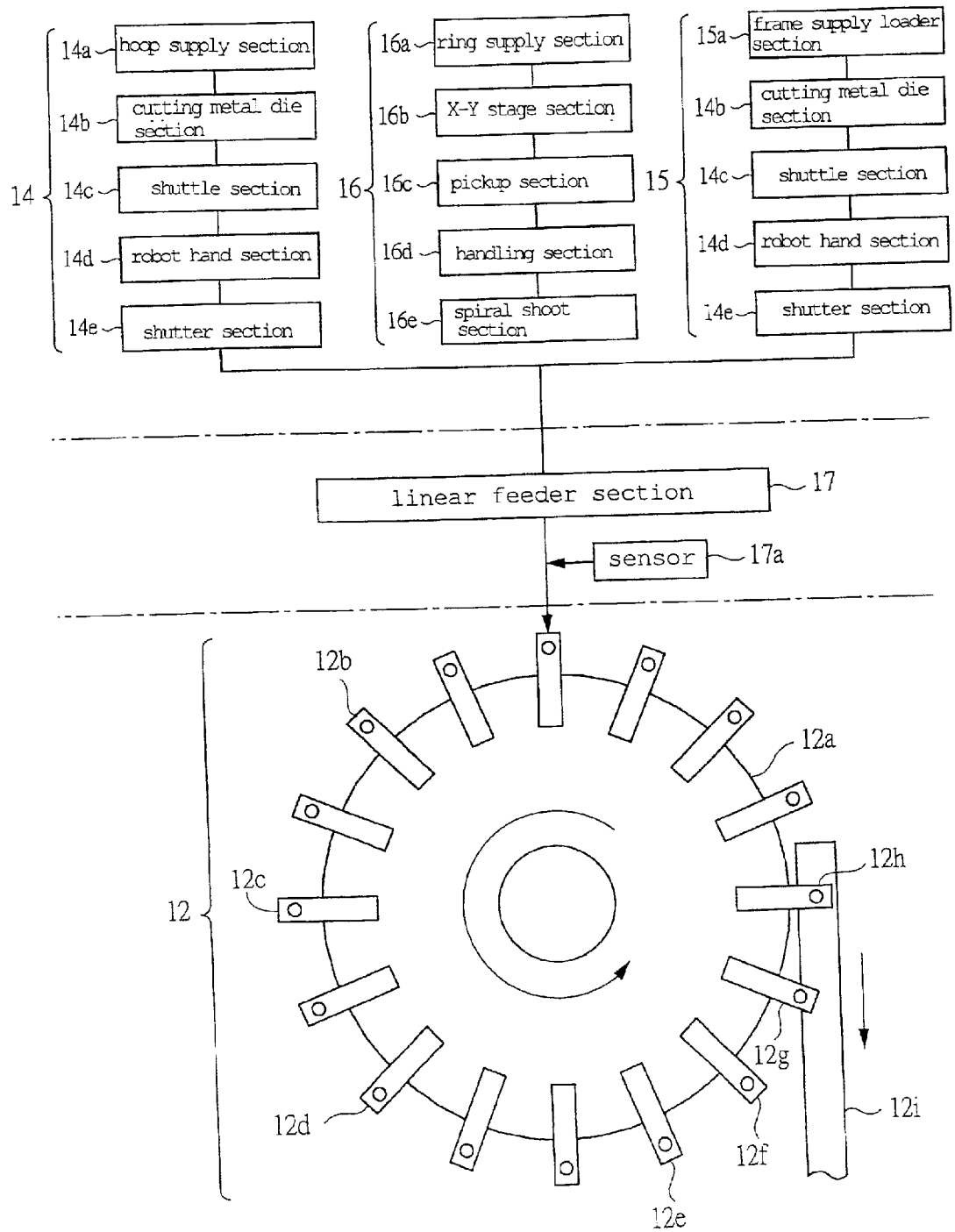
FIG. 2 is a schematic block diagram illustrating the three different configurations of the semiconductor device sorting systems of FIG. 1.
Figure 3:
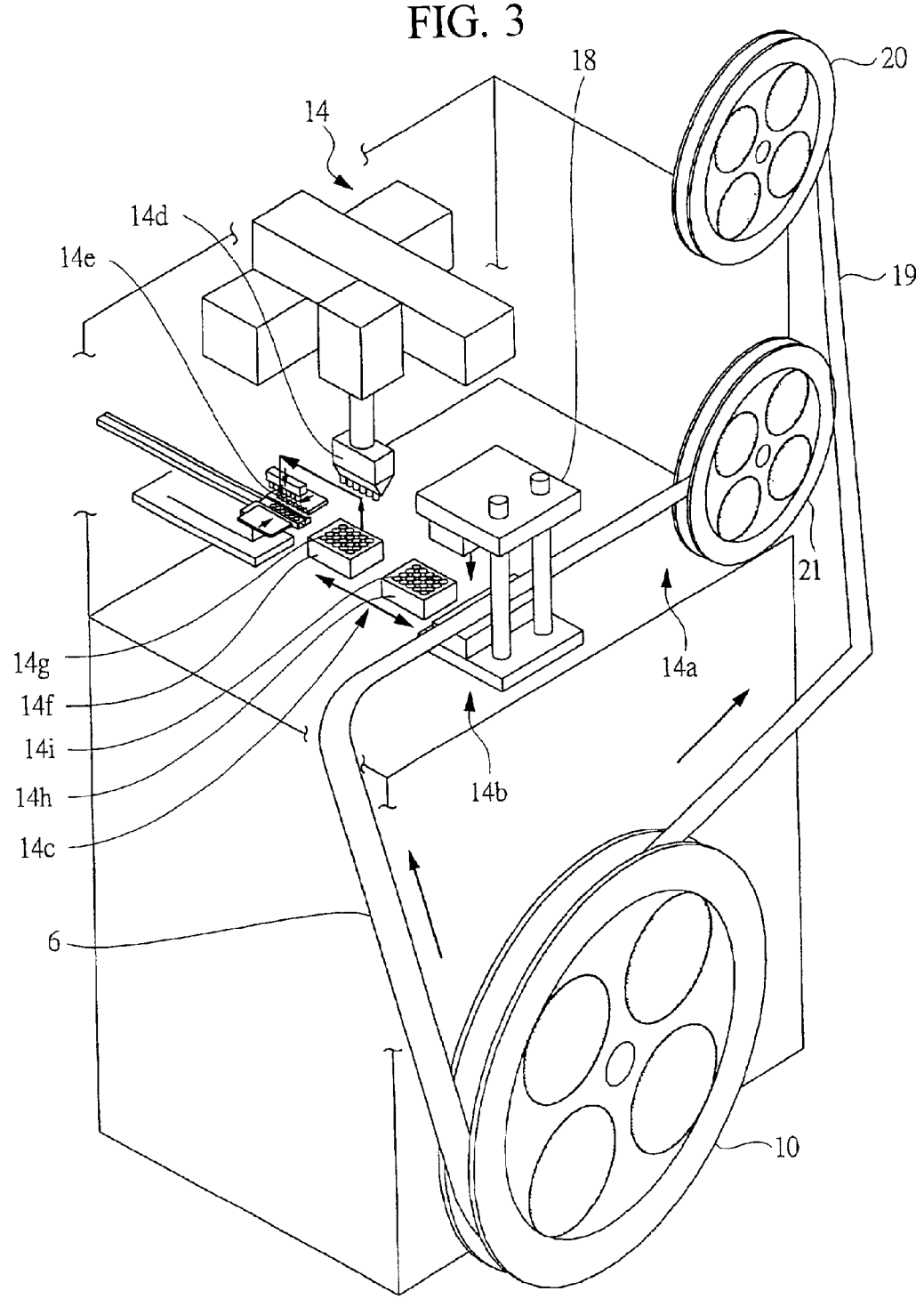
FIG. 3 is a schematic perspective view showing an example of the structure of the feeding section of the semiconductor device sorting system according to the first embodiment of the present invention.
Figure 4:
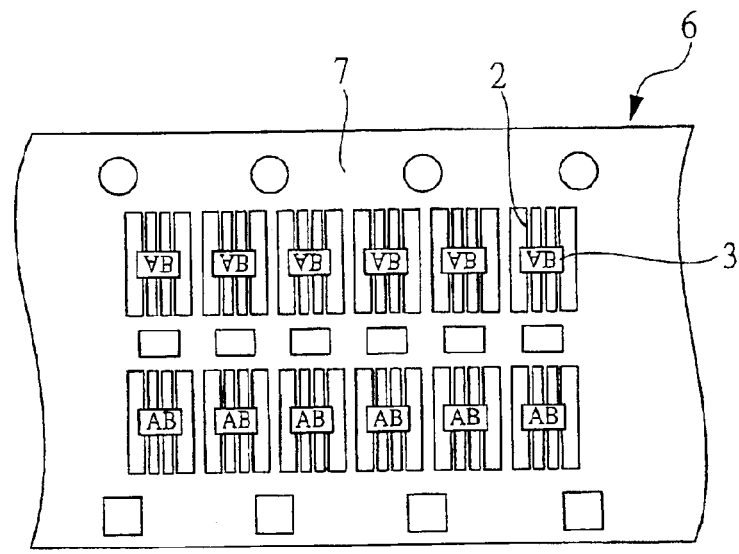
FIG. 4 is a schematic plan view showing an example of a structure of part of a tape-shaped frame used in the semiconductor device manufacturing method according to the first embodiment of the present invention.
Figure 5:
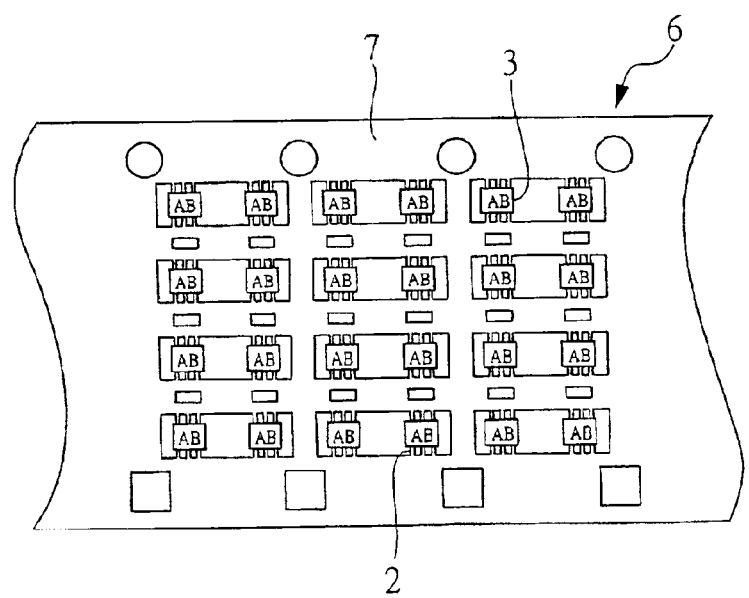
FIG. 5 is a schematic plan view showing a modification example of a structure of part of a tape-shaped frame used in the semiconductor device manufacturing method according to the first embodiment of the present invention.
Figure 6:
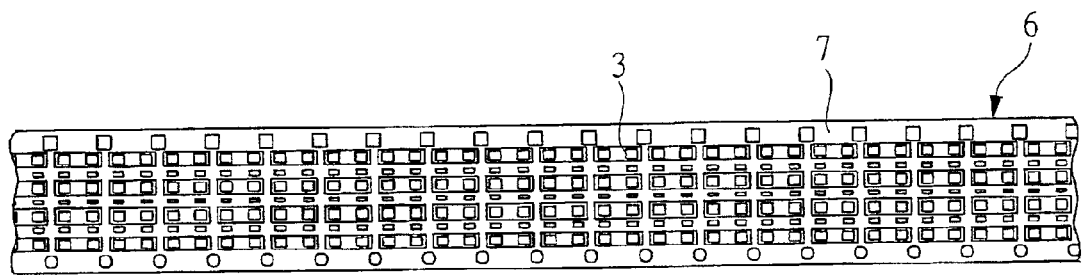
FIG. 6 is a schematic plan view showing an example of a structure of part of a tape-shaped frame used in the semiconductor device manufacturing method according to the first embodiment of the present invention.
Figure 7:
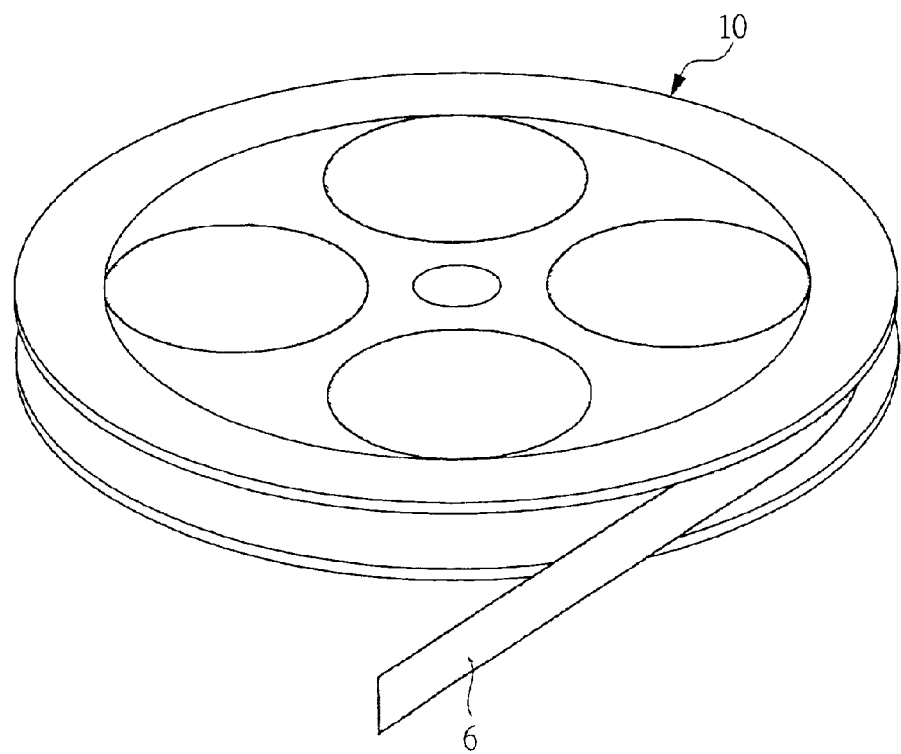
FIG. 7 is a schematic perspective view of a structure of the tape-shaped frame of FIG. 6.
Figure 8:
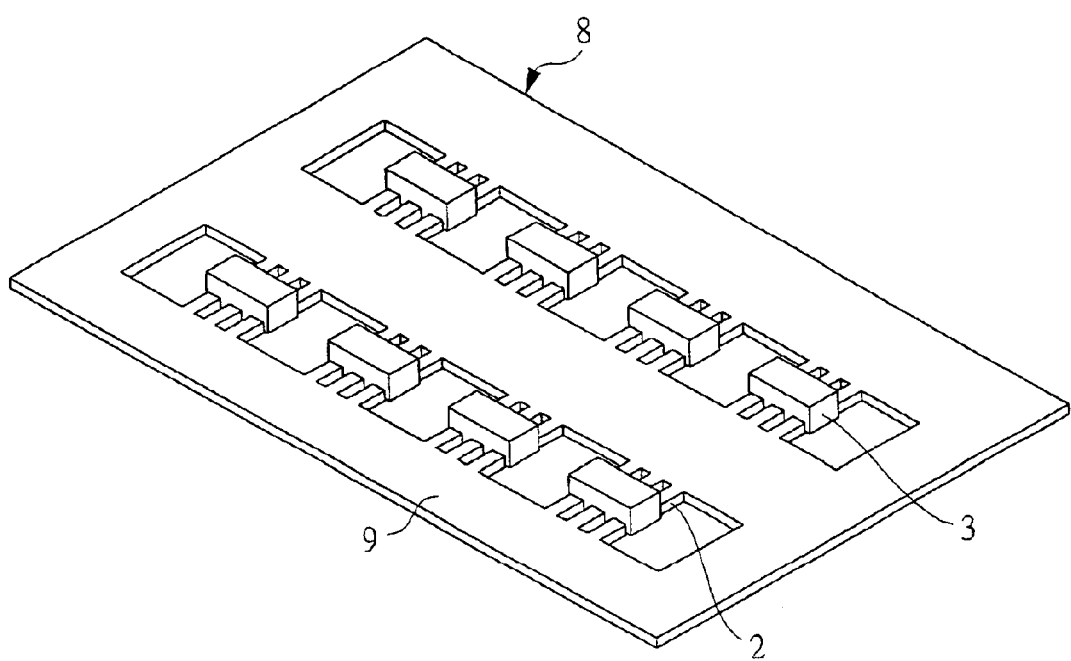
FIG. 8 is a schematic perspective view showing a structure of a strip-shaped frame used in the semiconductor device manufacturing method according to the first embodiment of the present invention.
Figure 9:
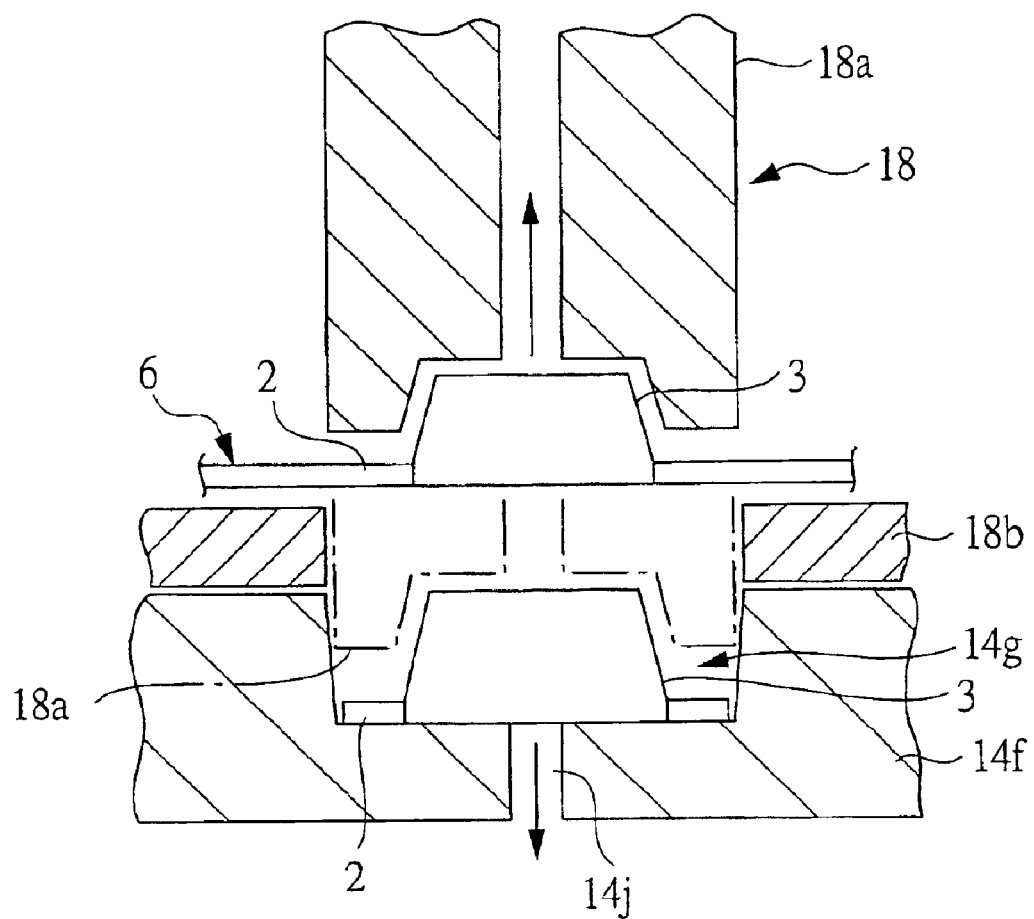
FIG. 9 is a schematic cross sectional view of part of a structure of a semiconductor device being manufactured by the semiconductor device manufacturing method according to the first embodiment of the present invention, which shows the state of the leads thereof being cut.
Figure 10:
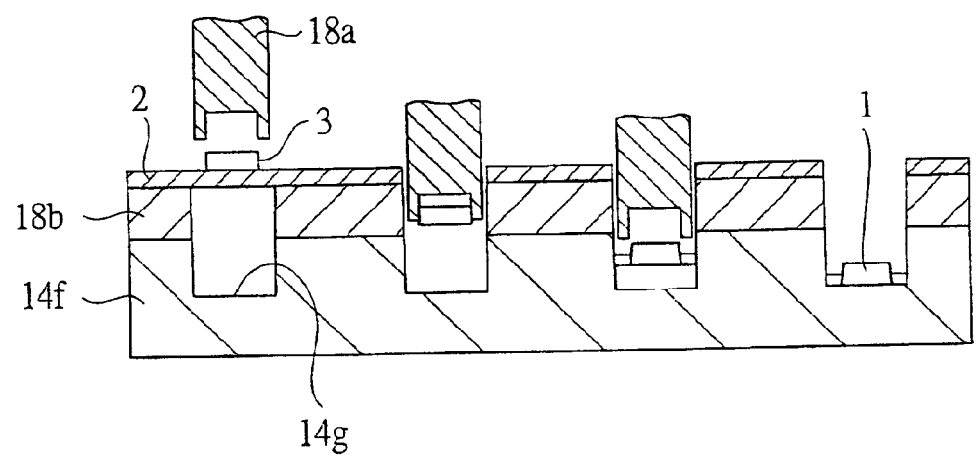
FIG. 10 is a schematic cross sectional view of part of a semiconductor device being manufactured by the semiconductor device manufacturing method according to the first embodiment of the present invention, which shows an example of the operation of the cutting punches for cutting the leads thereof.
Figure 11:
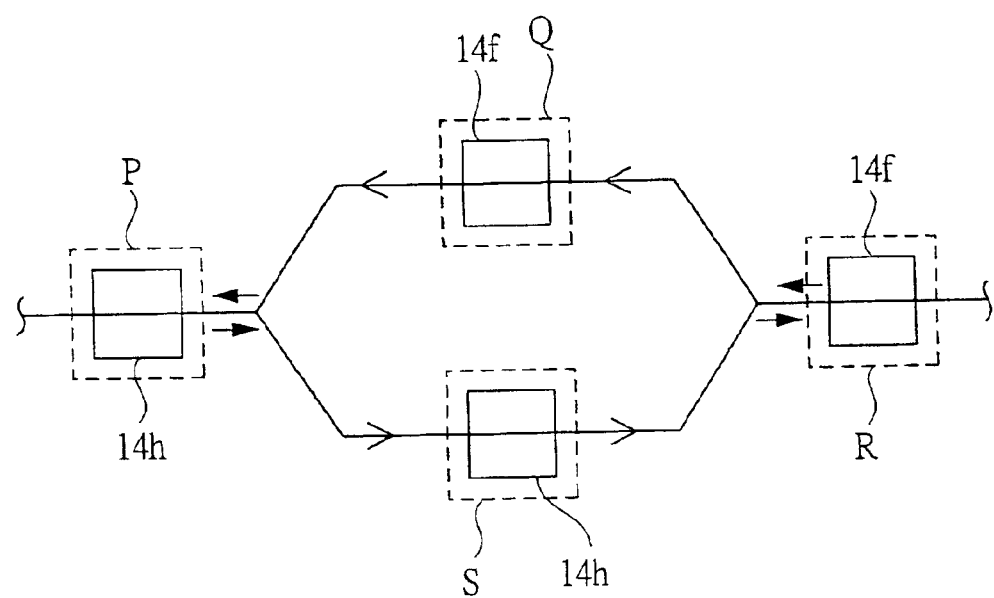
FIG. 11 is a schematic conceptual illustration of the reciprocating operation of shuttles used in the semiconductor device manufacturing method according to the first embodiment of the present invention.
Figure 12:
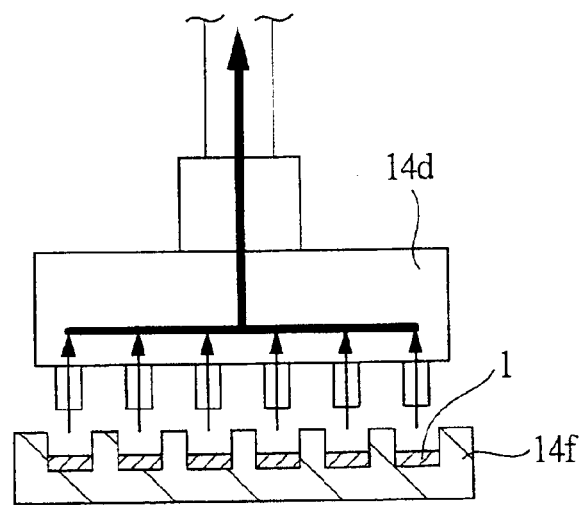
FIG. 12 is a schematic cross sectional view of a robot hand section used in the semiconductor device manufacturing method according to the first embodiment of the present invention, which illustrates an example of the operation of its vacuum suction.
Figure 13:
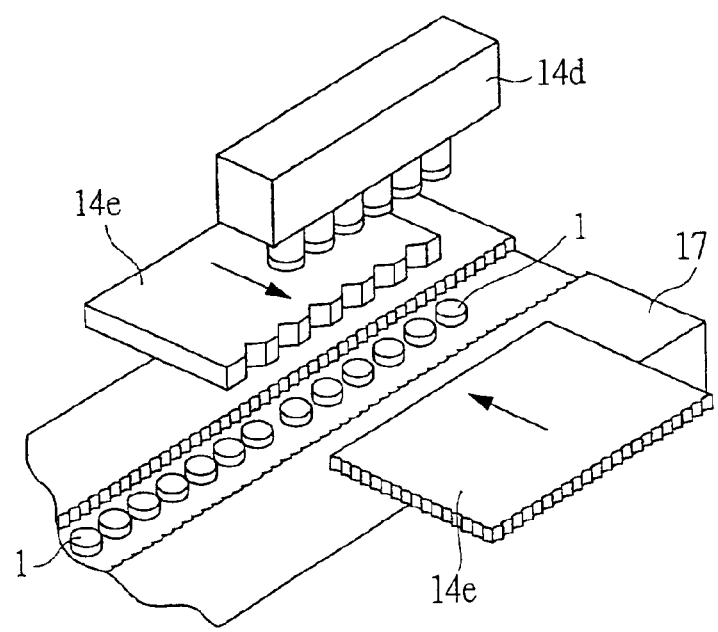
FIG. 13 is a schematic perspective view of part of a shutter section used in the semiconductor device manufacturing method according to the first embodiment of the present invention, which illustrates an example of its shielding operation.
Figure 14:
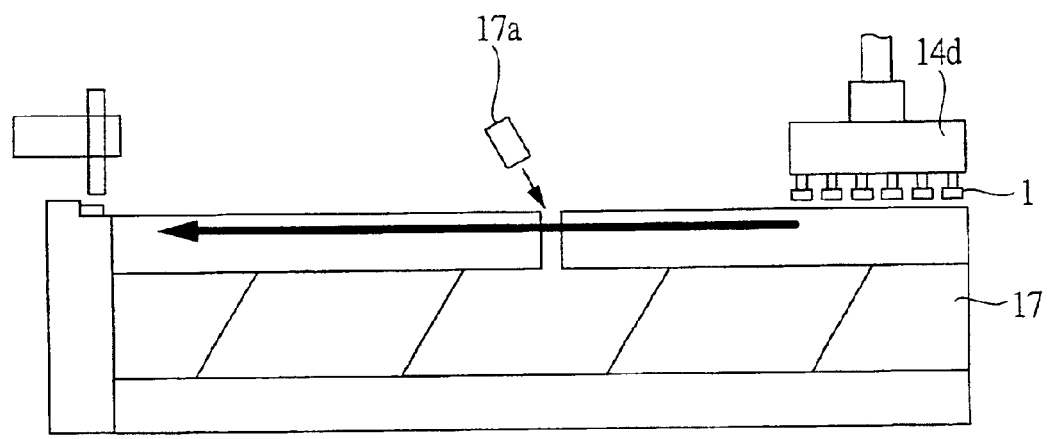
FIG. 14 is a schematic cross sectional view of part of a linear feeder used in the semiconductor device manufacturing method according to the first embodiment of the present invention, which illustrates an example of its structure.
Figure 15:
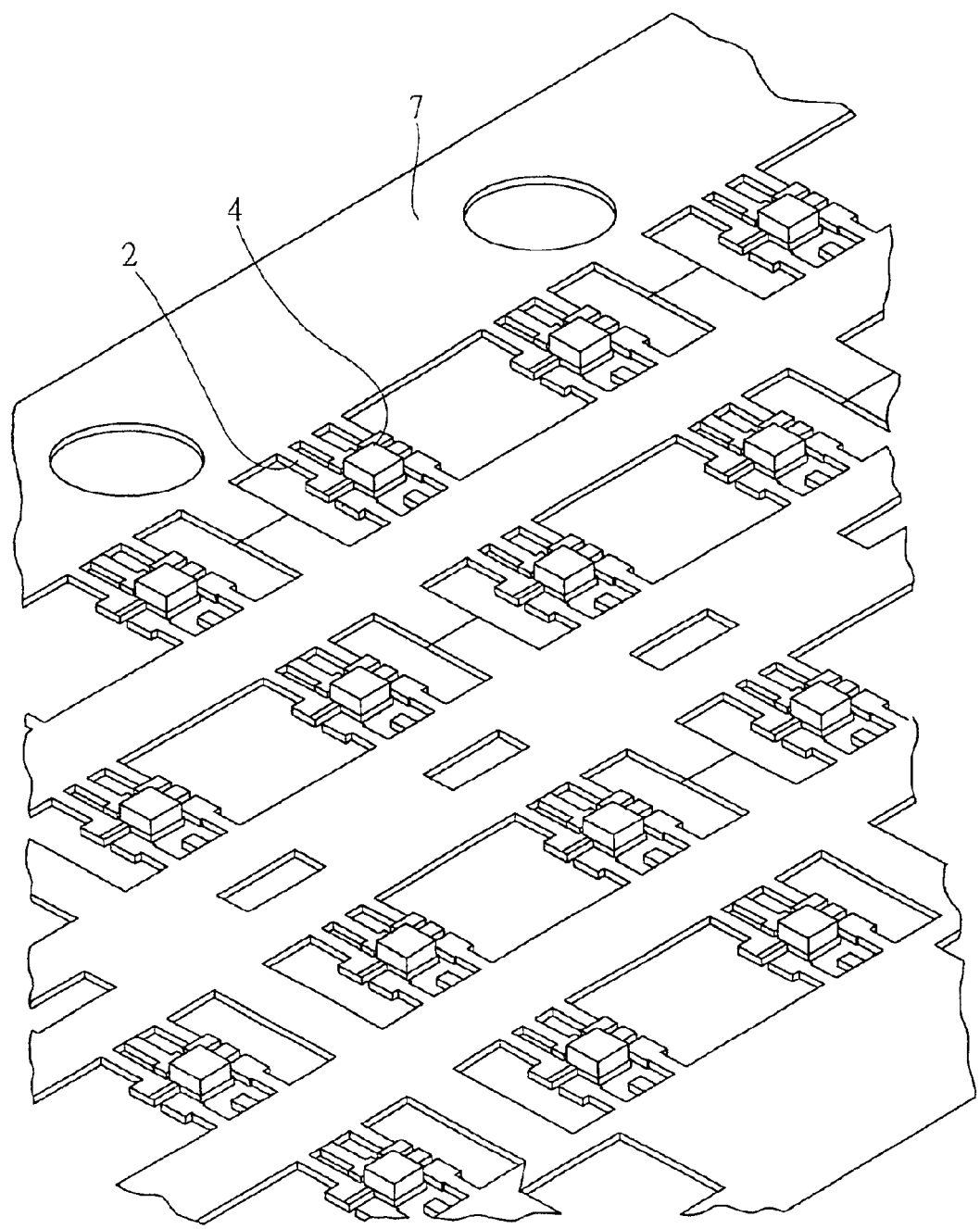
FIG. 15 is a schematic perspective view of a part of a tape-shaped frame used in the semiconductor device manufacturing method according to the first embodiment of the present invention, which illustrates an example of the pellet attaching step.
Figure 16:
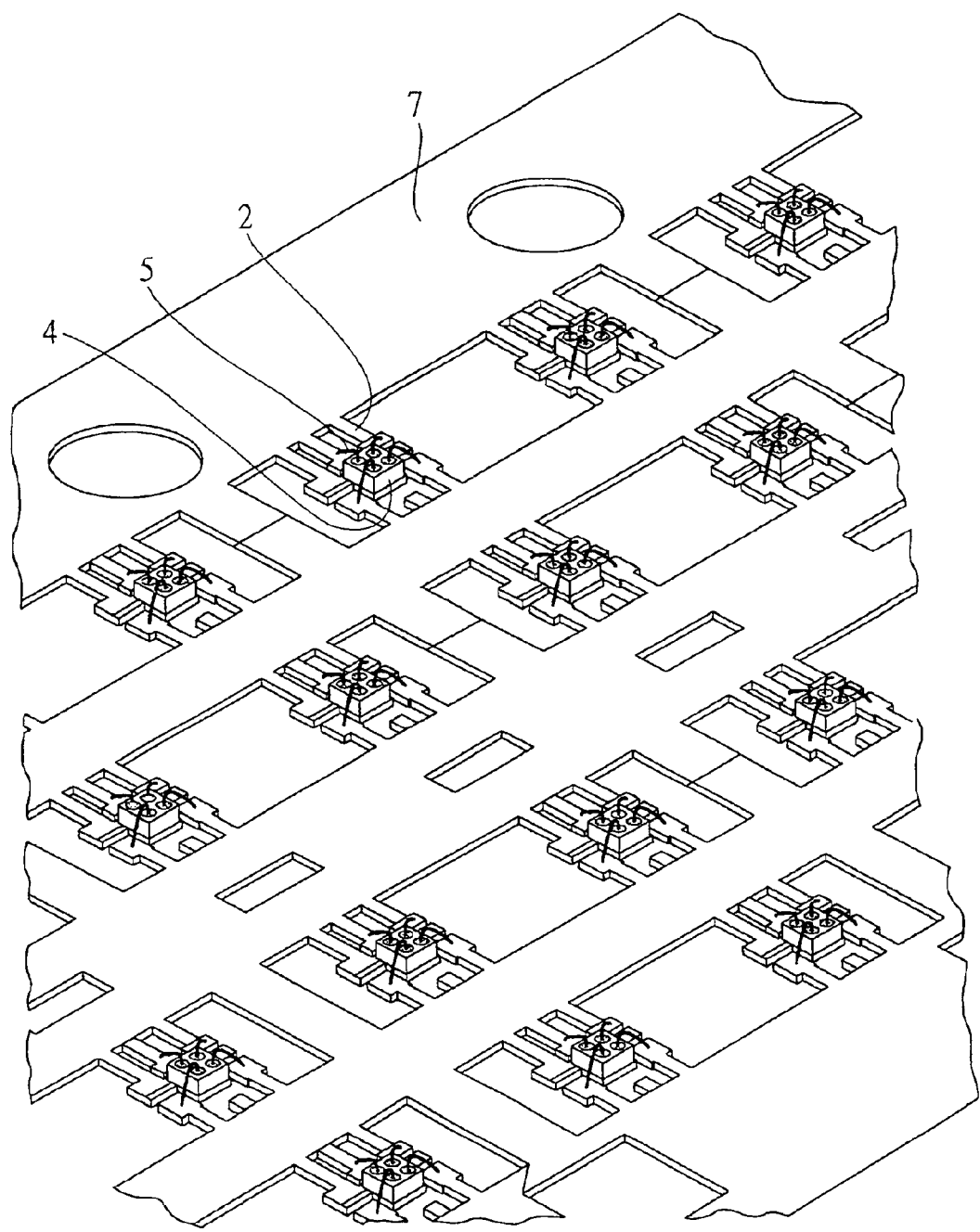
FIG. 16 is a schematic perspective view of part of a tape-shaped frame used in the semiconductor device manufacturing method according to the first embodiment of the present invention, which illustrates an example of the wire bonding step.
Figure 17:
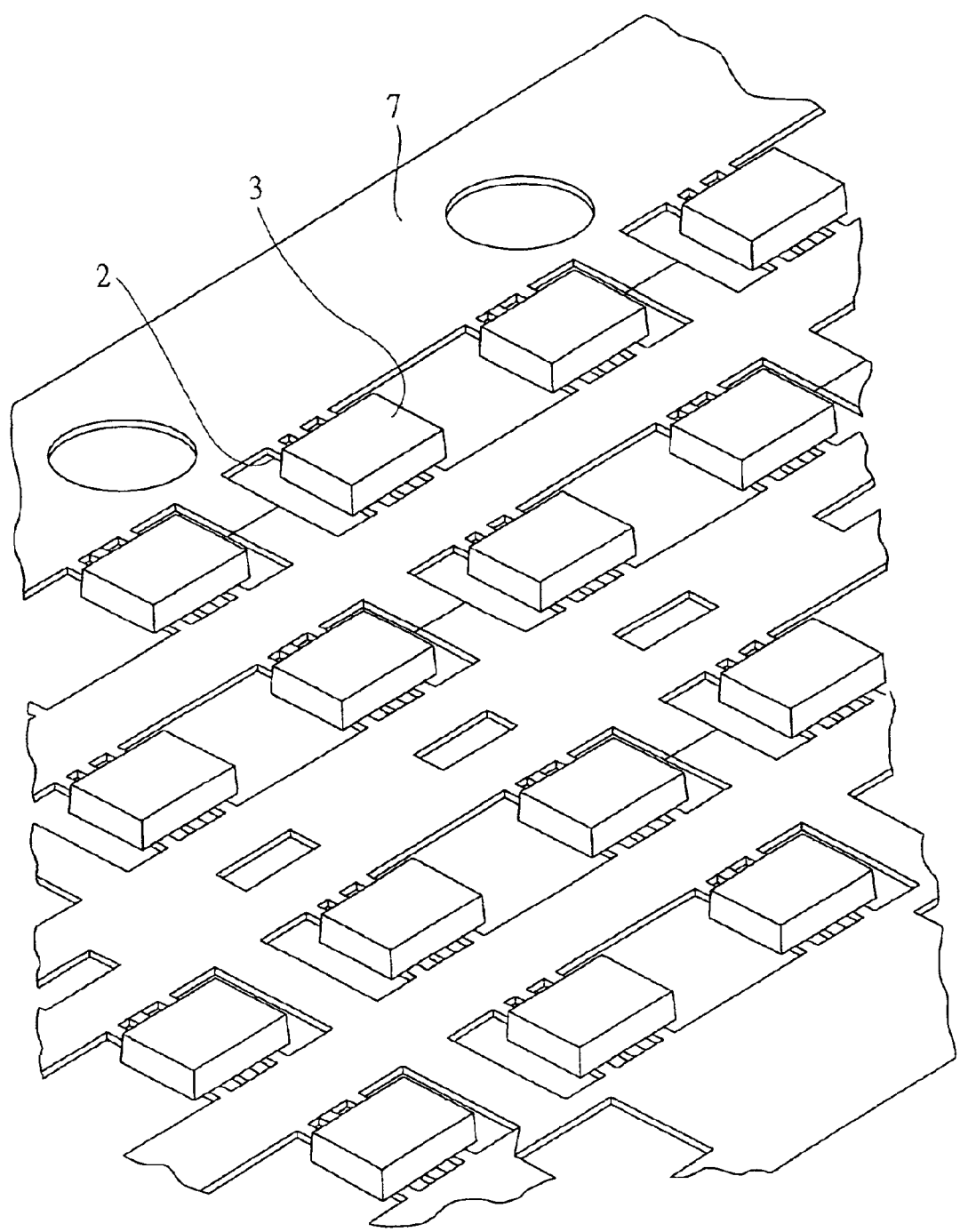
FIG. 17 is a schematic perspective view of a part of a tape-shaped frame used in the semiconductor device manufacturing method according to the first embodiment of the present invention, which illustrates an example of the molding step.
Figure 18:
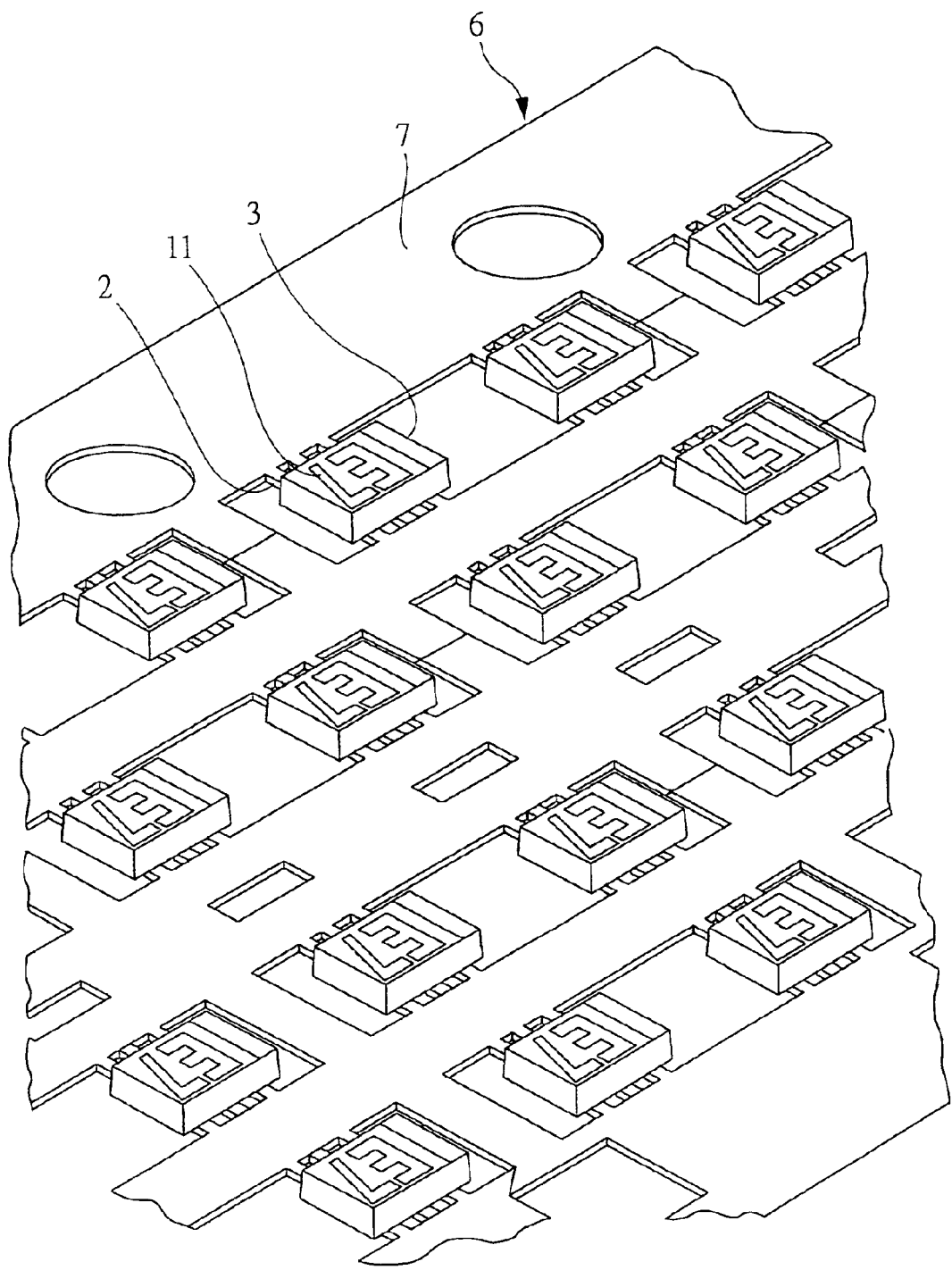
FIG. 18 is a schematic perspective view of a part of a tape-shaped frame used in the semiconductor device manufacturing method according to the first embodiment of the present invention, which illustrates an example of the mark processing step.
Figure 19:
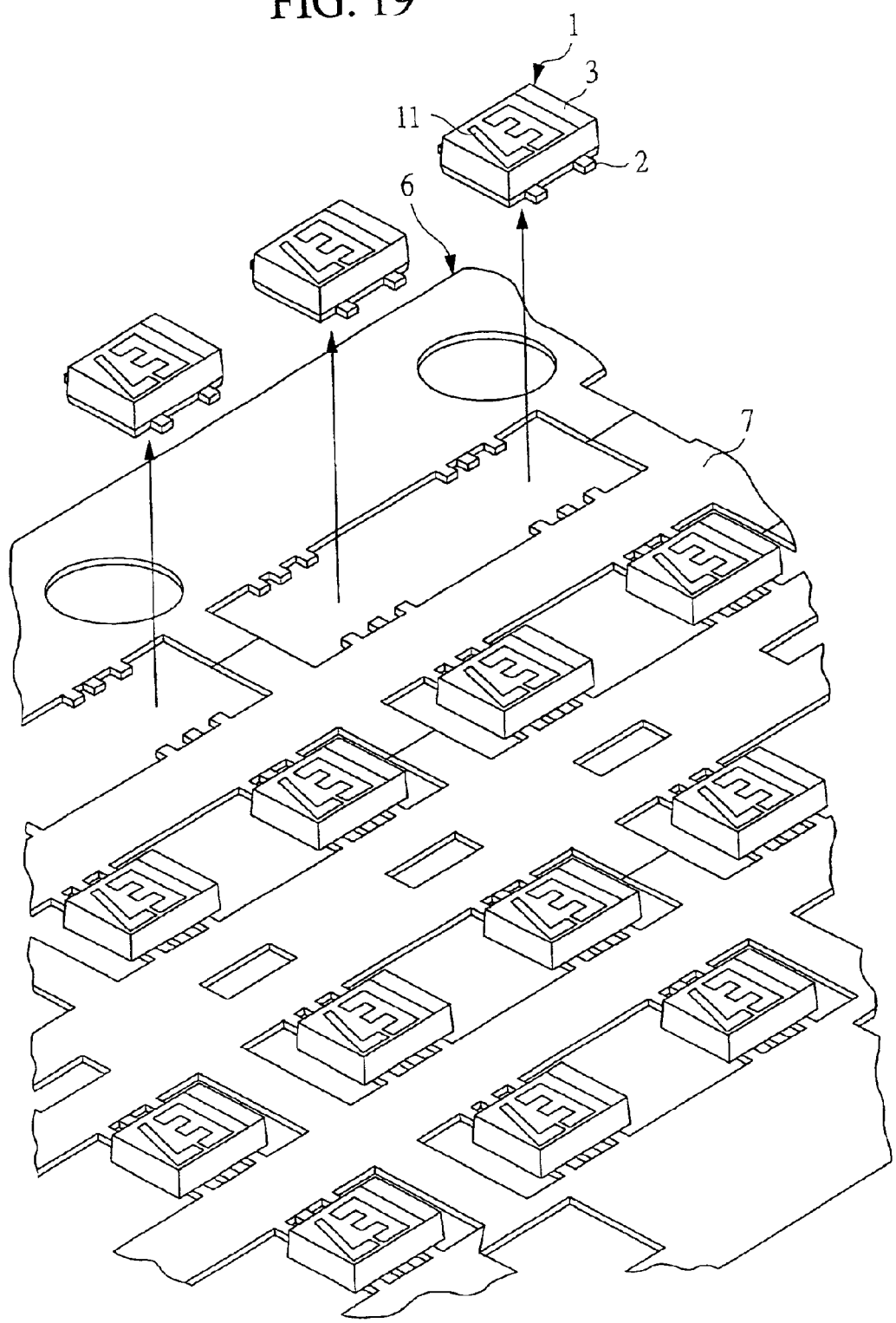
FIG. 19 is a schematic perspective view of a part of a tape-shaped frame used in the semiconductor device manufacturing method according to the first embodiment of the present invention, which illustrates an example of the lead cutting step.
Figure 20:
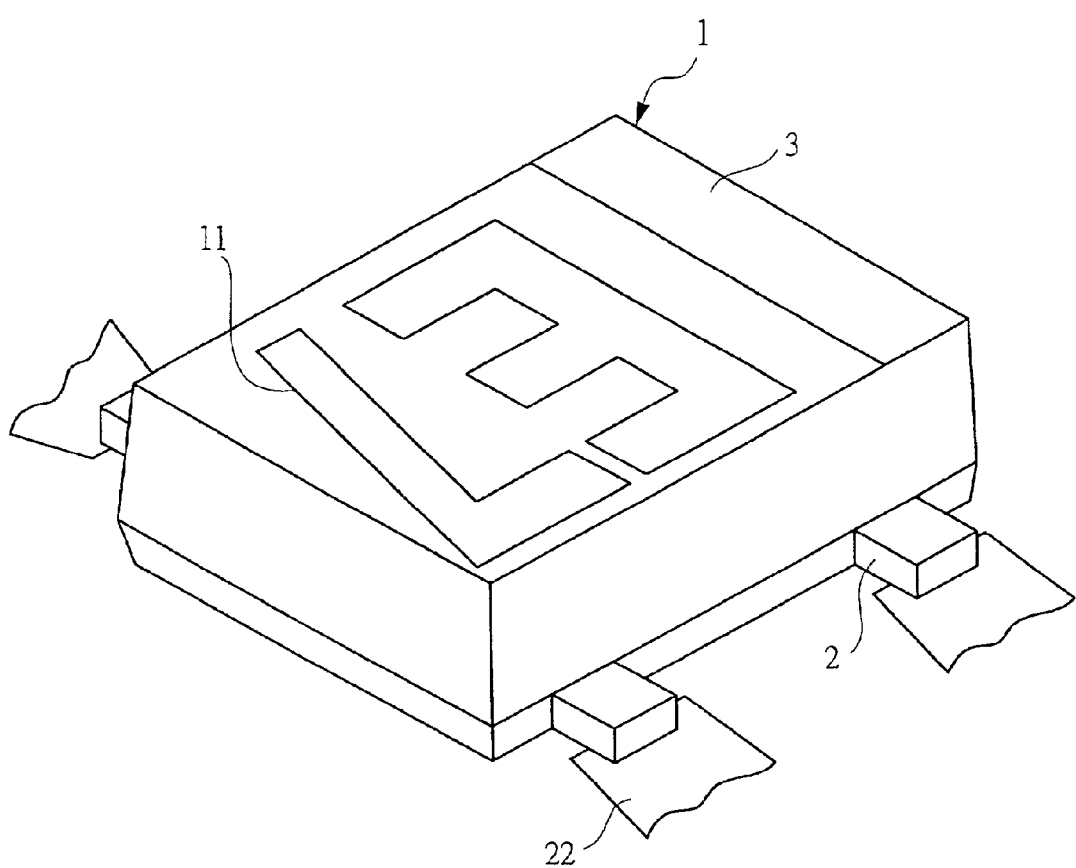
FIG. 20 is a schematic perspective view of a part of a tape-shaped frame used in the semiconductor device manufacturing method according to the first embodiment of the present invention, which illustrates an example of the sorting step.
Figure 21:
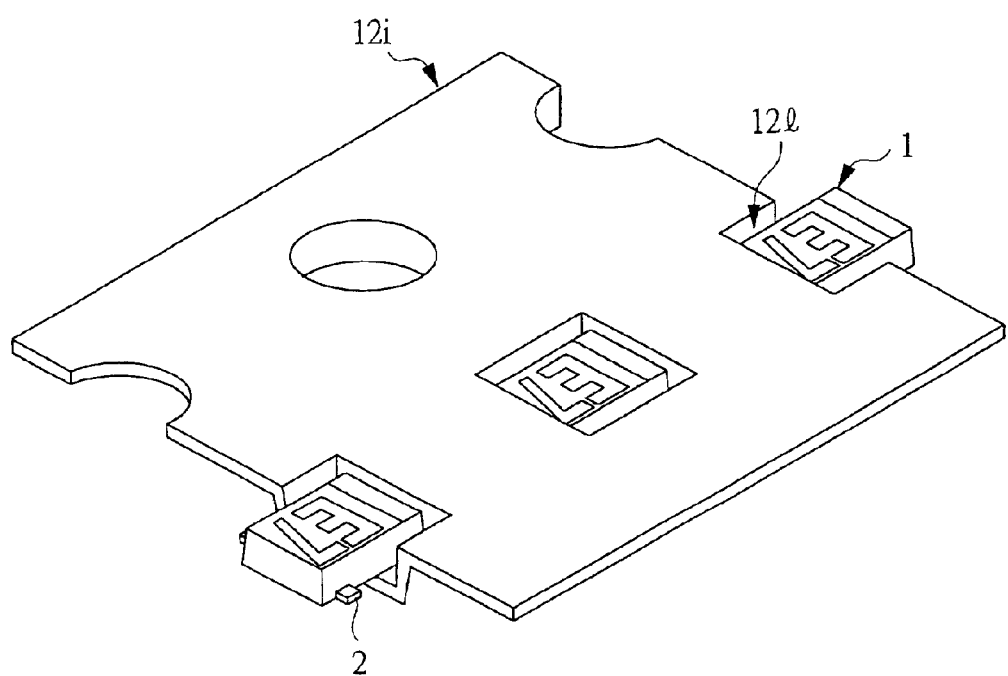
FIG. 21 is a schematic perspective view of a part of a tape-shaped frame used in the semiconductor device manufacturing method according to the first embodiment of the present invention, which illustrates an example of the taping step.
Figure 37:
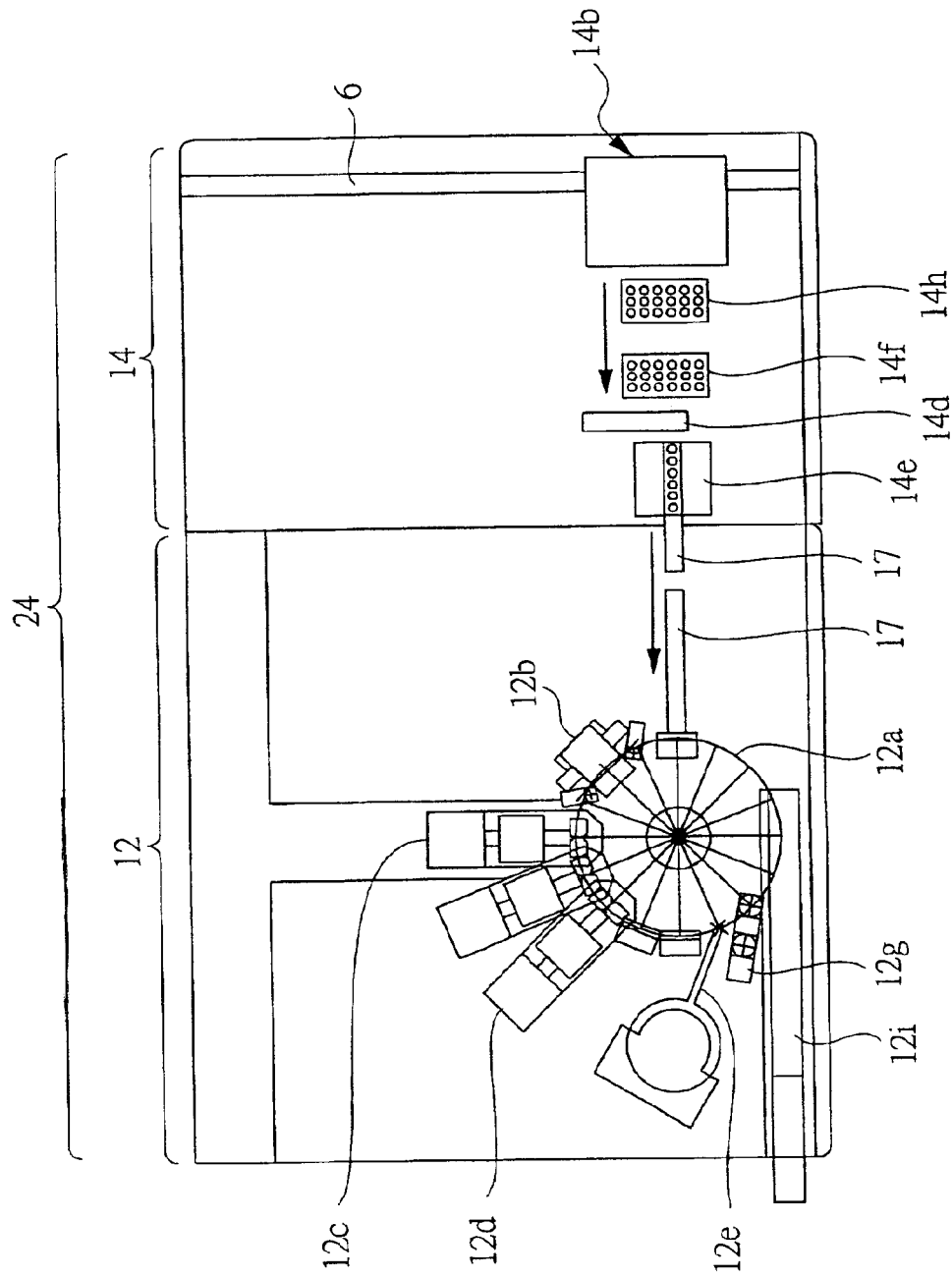
FIG. 37 is a schematic plan view showing an example of a structure of a hoop-adapting sorting system according to the first embodiment of the present invention.

FIG. 1 is a schematic exterior perspective view illustrating an example of three types of semiconductor device sorting systems used in a semiconductor device manufacturing method according to the present invention. FIG. 2 is a schematic block diagram illustrating the three different configurations of the semiconductor device sorting systems of FIG. 1. FIG. 3 is a schematic perspective view showing an example of the structure of the feeding section of the semiconductor device sorting system according to the first embodiment of the present invention. FIG. 4 is a schematic plan view showing an example of a structure of part of a tape-shaped frame used in the semiconductor device manufacturing method according to the first embodiment of the present invention. FIG. 5 is a schematic plan view showing a modification example of a structure of part of a tape-shaped frame used in the semiconductor device manufacturing method according to the first embodiment of the present invention. FIG. 6 is a schematic plan view showing an example of a structure of part of a tape-shaped frame used in the semiconductor device manufacturing method according to the first embodiment of the present invention. FIG. 7 is a schematic perspective view of a structure of the tape-shaped frame of FIG. 6. FIG. 8 is a schematic perspective view showing a structure of a strip-shaped frame used in the semiconductor device manufacturing method according to the first embodiment of the present invention. FIG. 9 is a schematic cross sectional view of part of a structure of a semiconductor device being manufactured by the semiconductor device manufacturing method according to the first embodiment of the present invention, which shows the state of the leads thereof being cut. FIG. 10 is a schematic cross sectional view of part of a semiconductor device being manufactured by the semiconductor device manufacturing method according to the first embodiment of the present invention, which shows an example of the operation of the cutting punches for cutting the leads thereof. FIG. 11 is a schematic conceptual illustration of the reciprocating operation of shuttles used in the semiconductor device manufacturing method according to the first embodiment of the present invention. FIG. 12 is a schematic cross sectional view of a robot hand section used in the semiconductor device manufacturing method according to the first embodiment of the present invention, which illustrates an example of the operation of its vacuum suction. FIG. 13 is a schematic perspective view of part of a shutter section used in the semiconductor device manufacturing method according to the first embodiment of the present invention, which illustrates an example of its shielding operation. FIG. 14 is a schematic cross sectional view of part of a linear feeder used in the semiconductor device manufacturing method according to the first embodiment of the present invention, which illustrates an example of its structure. FIG. 15 is a schematic perspective view of a part of a tape-shaped frame used in the semiconductor device manufacturing method according to the first embodiment of the present invention, which illustrates an example of the pellet attaching step. FIG. 16 is a schematic perspective view of part of a tape-shaped frame used in the semiconductor device manufacturing method according to the first embodiment of the present invention, which illustrates an example of the wire bonding step. FIG. 17 is a schematic perspective view of a part of a tape-shaped frame used in the semiconductor device manufacturing method according to the first embodiment of the present invention, which illustrates an example of the molding step. FIG. 18 is a schematic perspective view of a part of a tape-shaped frame used in the semiconductor device manufacturing method according to the first embodiment of the present invention, which illustrates an example of the mark processing step. FIG. 19 is a schematic perspective view of a part of a tape-shaped frame used in the semiconductor device manufacturing method according to the first embodiment of the present invention, which illustrates an example of the lead cutting step. FIG. 20 is a schematic perspective view of a part of a tape-shaped frame used in the semiconductor device manufacturing method according to the first embodiment of the present invention, which illustrates an example of the sorting step. FIG. 21 is a schematic perspective view of a part of a tape-shaped frame used in the semiconductor device manufacturing method according to the first embodiment of the present invention, which illustrates an example of the taping step. FIG. 37 is a schematic plan view showing an example of a structure of a hoop-adapting sorting system according to the first embodiment of the present invention.

In the semiconductor device manufacturing method according to the first embodiment of the present invention, description will be made for the fabrication of small transistors 1 (semiconductor devices) shown in FIG. 20.

Referring to FIG. 20, the transistor 1 is provided with a semiconductor pellet 4, leads 2 for external connection, wires 5 connecting the electrodes of the semiconductor pellet 4 and the corresponding leads 2 respectively, which are shown in FIG. 16, and a sealed element 3 shown in FIG. 20 made of resin for sealing the semiconductor pellet 4 and the wires 5. A mark that typically shows the type of the transistor 1 is applied to the surface of the sealed element 3.

The sealed element 3 of the transistor 1 normally has dimensions as small as 1.2×1.6 mm.

The wires 5 are typically metal wires having a diameter of about 18 to 32 $\mu$m and the leads 2 are typically thin plate-shaped members made of copper or an iron-nickel alloy. The sealed element 3 is typically made of epoxy resin, at least partly.

Now, the semiconductor device sorting system to be used in the sorting step in the semiconductor device manufacturing method according to the first embodiment of the present invention for fabricating transistors 1 will be described below.

Referring to FIG. 1, the semiconductor device sorting system is composed of a sorting section 12 for sorting transistors 1 (see FIG. 20) into good ones and defective ones according to the electric performance of each of them and a supply section that operates as supply source for supplying transistors 1 to the sorting section 12. Note that in this semiconductor device sorting system, an appropriate supply section can be set depending on the supply types of the unseparated transistor parts so as to correspond to the types of the transistors 1 to be produced.

In other words, if necessary, the current supply section can be replaced by another supply section that corresponds to the supply type of the unseparated transistor parts.

Any of the three systems as illustrated in FIG. 1 can be used for the system for supplying transistor parts according to the present invention.

The first one is adapted to use a tape-shaped frame 6 as shown in FIG. 6. It is also referred to as a hoop frame. It is a complex of a plurality of sealed elements 3 each having a semiconductor pellet 4 and a tape-shaped frame main body 7 serving as a link member for linking them and having a plurality of leads 2 formed thereon. A plurality of sealed elements 3 are arranged in rows along the tape and the sealed elements 3 of each row are arranged longitudinally at predetermined regular intervals on the tape-shaped frame main body 7.

The tape-shaped frame 6 is made of metal and has a plurality of transistor regions, each of which carries a plurality of leads 2 and a sealed element 3 formed thereon. Thus, it is a complex of such elements.

FIG. 4 shows a tape-shaped frame 6, wherein sealed elements 3 are arranged in two rows along the tape. On the other hand FIG. 5 shows a tape-shaped frame 6, wherein sealed elements 3 are arranged in four rows along the tape.

The tape-shaped frame 6 is wound around a reel 10 as shown FIG. 7 for the convenience of transportation and set in position in the supply section in that state.

The second system for supplying transistor parts is adapted to use a strip-shaped frame 8 as shown in FIG. 8. It is a complex of a plurality of sealed elements 3 each having a semiconductor pellet 4 and a strip-shaped frame main body 9 serving as a link member for linking them and having a plurality of leads 2 formed thereon. A plurality of sealed elements 3 are arranged in the form of a matrix of a plurality of rows×a plurality of columns on the strip-shaped frame main body 9.

In other words, a strip-shaped frame 8 is equivalent to the tape-shaped frame 6 cut to a predetermined length.

Figure 23:
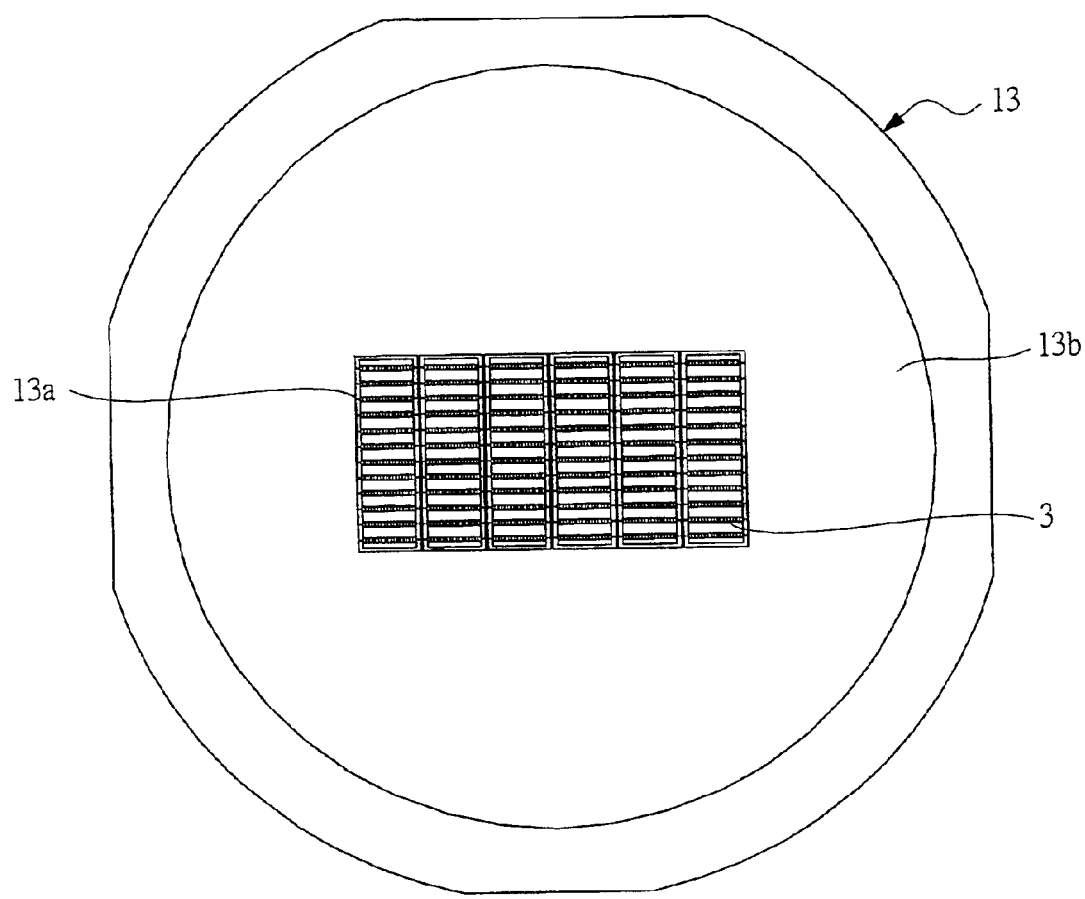
FIG. 23 is a schematic plan view of a ring member used in the semiconductor device manufacturing method according to the second embodiment of the present invention, which illustrates an example of the structure thereof.
Figure 24:
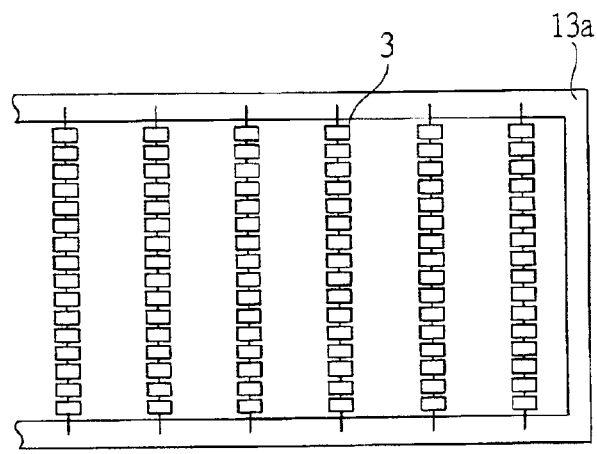
FIG. 24 is a schematic partial plan view of the ring member of FIG. 23, which illustrates the structures of some of the sealed elements attached to the ring member.

The third system for supplying transistor parts is adapted to use a ring member 13 as shown in FIGS. 23 and 24. It is a complex holding an adhesive tape 13b by its outer periphery. To the adhesive tape 13b, a plurality of sealed elements 3 arranged in the form of a matrix, each having a semiconductor pellet 4, and a support frame 13a for supporting the sealed elements 3 are bonded.

Thus, a hoop-adapting supply section 14, a frame-adapting supply section 15 and a carrier ring supply section 16 as shown in FIG. 1 are provided and one of the supply sections is selected according to the type of product to be sorted and linked to a single sorting section 12 so that products of any of given different types may be tested for performance and sorted by a single sorting section 12.

In other words, a semiconductor device sorting system according to the present invention is realized by linking one of the supply sections shown in FIG. 1 to the sorting section 12 depending on the type of product to be sorted. A hoop-adapting sorting system 24 shown in FIG. 37 and realized by linking the sorting section 12 and the hoop-adapting supply section 14 will be described in the first embodiment.

The sorting section 12 is provided with a number of heads to be used for various operations including an operation of testing the electric performance of each transistor and sorting the tested transistors. The heads are arranged along the outer periphery of a rotary disk 12a as shown in FIG. 2. Given operations are conducted on the transistors 1 by the heads as the disk 12a is driven to rotate at a predetermined pitch.

For example, the heads may include a cutting head 12b for cutting leads of gull wing type semiconductor devices, a forming head 12c for bending to show a form like a gull-wing, a sorting head 12d for testing the electric performance of each transistor and sorting the tested transistors, a defect classifying head 12e for classifying defective transistors 1 that are determined to be defective by the performance test, an orientation head 12f for directing the transistors 1 being transported in the same direction, an appearance examination head 12g for examining the appearance of each transistor 1, and a taping head 12h for putting each transistor 1 to be shipped into a receiving section 12l of a shipping tape 12i shown in FIG. 21.

It should be noted that the heads are not limited to those listed above and other heads may be added and/or the existing heads may be replaced by others depending on the type of semiconductor device.

As shown in FIG. 1, a shipping tape reel 12j for delivering shipping tape 12i and a shipping tape take-up reel 12k for taking up a shipping tape 12i can be installed to the sorting section 12.

Now, the hoop-adapting supply section 14 will be described in terms of its configuration.

As shown in FIGS. 2 and 3, the hoop-adapting supply section 14 is provided with a hoop supply section 14a for receiving a feed reel 10 for feeding a tape-shaped frame 6, a cutting metal die section 14b for cutting and separating sealed elements 3 from the tape-shaped frame 6, a shuttle section 14c for receiving the cut and separated transistors 1, a robot hand section 14d for taking up and moving transistors 1 from the shuttle section 14c, and a shutter section 14e for separating transistors 1 from the robot hand section 14d.

As shown in FIG. 3, the shuttle section 14c has a first shuttle 14f (separated pieces conveyor) and a second shuttle 14h (separated pieces conveyor), each of which is provided with sets of pockets 14g or 14i that are recesses functioning to receive the separated transistors. The pockets 14g and 14i are arranged at positions corresponding to those of sealed elements 3 of the tape-shaped frame 6.

More specifically, each of the separated pieces conveyors is provided with a plurality of recesses arranged in the form of a matrix that corresponds to the matrix of the sealed elements 3 of the tape-shaped frame 6 that are cut and separated collectively in a single operation. When cutting the leads, one of the separated pieces conveyor is placed below the tape-shaped frame 6 in the cutting metal die section 14b so that the transistors 1 that are collectively cut and separated in a single operation are received in the respective recesses of the separated pieces conveyor.

The separated pieces conveyors are movable back and forth between a position below the cutting metal die section 14b and a position below the robot hand section 14d shown in FIG. 3.

More specifically, each of the separated pieces conveyors is provided with a plurality of recesses for receiving semiconductor devices arranged in the form of a matrix and arranged so as to be able to reciprocate between a position below the cutting metal die section 14b and a position below the robot hand section 14d.

Note that in the hoop-adapting sorting system 24 of the first embodiment composed of the hoop-adapting supply section 14 and the sorting section 12, while the first shuttle 14f is moving forward, the second shuttle 14h is made to be moving backward correspondingly and, when the two shuttles meet each other on the way, one of them is lifted upward and the other is pushed downward to avoid collision as shown in FIG. 11. In this way, the two shuttles linearly reciprocate on the same path in a concerted manner without collision.

Also, the cutting metal die section 14b is provided with a cutting die 18 that is adapted to cut out a given number of sealed elements 3 from the tape-shaped frame 6 and separate them from each other. For example, when sealed elements 3 are arranged in four rows along the tape-shaped frame 6, the leads 2 of a total of 24 transistors arranged in the form of a matrix of 4 rows and 6 columns may be cut out collectively into the respective sealed elements 3.

The cutting metal die 18 is provided with a cutting punch 18a that sucks the sealed elements 3 when cutting the tape-shaped frame 6 to separate the sealed elements 3 from the tape-shaped frame 6.

A linear feeder section (parts feeder) 17 is arranged at a position linking the hoop-adapting supply section 14a and the sorting section 12.

The linear feeder section 17 extends straight and is adapted to linearly arrange the transistors that are cut and separated from each other by the hoop-adapting supply section 14a and brought to the linear feeder section 17 by the robot hand section 14d and feed them one by one to the sorting section 12.

More specifically, the linear feeder section 17 utilizes vibrations to align transistors 1 and supply them one by one to the sorting section 12.

The robot hand section 14d can suck and hold at a time the transistors 1 that are cut, separated and held in the respective pockets 14g of the first shuttle 14f and the pockets 14i of the second shuttle 14h and deliver and place them onto the straight linear feeder section 17 in a linearly aligned state.

More specifically, the robot hand section 14d can suck and hold the transistors 1 of a single row on the pockets 14g and 14i running along the longitudinal direction of the tape-shaped frame 6 at a time, turn by 90° with the transistors 1 sucked and held by it and then place them on the shutter section 14e located at the leading end of the linear feeder section 17 in a linearly aligned state as shown in FIG. 13. Thus, the transistors 1 are linearly arranged on the linear feeder section 17 in the longitudinal direction thereof.

As described above, the hoop-adapting sorting system 24 composed of the hoop-adapting supply section 14a and the sorting section 12 can sequentially carry out a number of operations starting from that of cutting (and separating) transistors 1 from a tape-shaped frame 6 and ending at that of taping the finished products.

Now, the method of manufacturing semiconductor devices (transistors 1) according to the first embodiment of the present invention will be described.

Firstly, a tape-shaped frame main body 7 as shown in FIG. 15 is prepared and subjected to a pellet mounting operation of mounting a plurality of semiconductor pellets, each having a transistor circuit, onto the tape-shaped frame main body 7.

Then, as shown in FIG. 16, a wire bonding operation of electrically connecting the electrodes of each semiconductor pellet 4 and corresponding leads 2 by means of wires 5 is conducted.

Subsequently, a molding operation of sealing each semiconductor pellet 4 and the wires 5 by means of sealing resin is conducted.

As a result, a plurality of sealed elements 3 are formed on the tape-shaped frame main body 7 as shown in FIG. 17.

Then, as a post molding treatment, the burrs around the leads, if any, are removed and the leads 2 are plated. The burrs are typically removed by a deflasher method or a liquid honing method.

The leads 2 may typically be plated by solder plating.

Thereafter, as shown in FIG. 18, each sealed element 3 is subjected to a marking operation of putting a mark 11 to the surface thereof. The mark 11 typically carries signs indicating the type of product and so on. A technique of laser marking using a YAG laser or a $CO_2$ laser may typically be used for the marking operation.

Then, each transistor is tested for its performance and sorted by means of the hoop-adapting sorting system 24 as shown in FIG. 37. As pointed out earlier, the hoop-adapting sorting system 24 is composed of a hoop-adapting supply section 14 and a sorting section 12 shown in FIG. 1.

Firstly, a tape-shaped frame 6 as shown in FIGS. 6 and 18 is prepared. The tape-shaped frame 6 is composed of a plurality of sealed elements 3, each having a semiconductor pellet 4, and a tape-shaped frame main body 7 carrying the sealed elements 3 in a linked condition. The sealed elements 3 are arranged successively at regular intervals.

More specifically, the tape-shaped frame 6 that is supplied to the tape-adapting supply section 14 of the tape-adapting sorting system 24 is wound around a reel 10 as shown in FIG. 7 and the reel 10 is set in position at a lateral side of the hoop-adapting supply section 14 as shown in FIG. 3.

At this time, the reel 10, a waste frame take-up reel 21 for taking up the waste tape-shaped frame 6 from which sealed elements have been cut and separated and an interlayer paper tape take-up reel 20 for taking up the interlayer paper tape 19 that has been laid between two adjacent layers of tape-shaped frame 6 are set in positions in such a way that the running direction of the tape-shaped frame 6 at the cutting metal die section 14b and the parts feeding direction of the linear feeder section 17 show a right angle as shown in FIG. 3.

With this arrangement, since the reel 10 that has a relatively large diameter is set in position at the hoop-adapting supply section 14 in such a way that the running direction of the tape-shaped frame 6 at the cutting metal die section 14b and the parts feeding direction of the linear feeder section 17 are never in parallel with each other as pointed out above, it is possible to reduce the dimensions of the semiconductor device sorting system and save space.

After the reel 10 is set in position at the hoop-adapting supply section 14, the tape-shaped frame 6 is fed from the reel 10 to the hoop-adapting supply section 14 and the leads are cut to separate the sealed elements 3 by the cutting metal die section 14b of the hoop-adapting supply section 14 as shown in FIG. 19.

Sealed elements 3 are arranged at regular intervals in four rows on the tape-shaped frame main body 7 as described above and the leads 2 of a total of 24 transistors arranged in the form of a matrix of 4 rows and 6 columns are collectively cut by the cutting metal die 18 to separate the sealed elements 3.

As a total of 24 transistors are collectively separated in the hoop-adapting supply section 14, a large number of leads are cut in a short period of time, which makes it possible to raise the throughput of the lead cutting operation of the sorting step.

Note that the pockets 14g of the first shuttle 14f arranged in 4 rows and 6 columns (or the pockets 14i of the second shuttle 14h) are placed respectively blow the corresponding cutting punches 18a of the cutting metal dies 18 in order to receive so many sealed elements 3 arranged in the form of a matrix of 4 rows and 6 columns on the tape-shaped frame 6 as shown in FIG. 9.

Under this condition, while the sealed elements 3 are sucked by means of vacuum to the respective cutting punches 18a that are also arranged in the form of a matrix of 4 rows and 6 columns as shown in FIGS. 9 and 10, the leads thereof 2 are pinched, supported and cut by the cutting punches 18a and the dies 18b.

Note that, during and after the cutting operation, the sealed elements 3 are sucked to the respective cutting punches 18a by means of vacuum and the front ends of the cutting punches 18a are pushed into the respective pockets 14g of the first shuttle 14f. Thereafter, the suction by vacuum to the cutting punches 18a is stopped immediately before the bottom surfaces (contact surfaces) of the sealed elements 3 reach the corresponding bottoms of the respective pockets 14g and, substantially at the same time, the sealed elements 3 are sucked by vacuum to the corresponding bottoms of the respective pockets 14g of the first shuttle 14f by means of respective suction holes 14j.

As a result, the leads of 24 transistors 1 are cut by the single cutting operation of the cutting metal die 18, and the 24 transistors 1 are received in the pockets 14g of the first shuttle 14f or the pockets 14i of the second shuttle 14h simultaneously, smoothly and quickly as they are guided by the respective cutting punches 18a.

Thereafter, the first shuttle 14f and the second shuttle 14h are alternately moved in a reciprocating manner and the separated transistors 1 are conveyed from the cutting metal die section 14b to a position located below the robot hand section 14d.

While the first shuttle 14f is moving forward, the second shuttle 14h is made to be moving backward correspondingly and, when the two shuttles meet each other on the way, one of them is lifted upward and the other is pushed downward to avoid collision as shown in FIG. 11. In this way, the two shuttles linearly reciprocate on the same path in a concerted manner without collision.

For example, while the first shuttle 14f is moving from the cutting metal die section 14b (position R in FIG. 11) to a position located below the robot hand section 14*d* (position P in FIG. 11) with carrying separated transistors 1, the second shuttle 14*h* is synchronously moving on the same path in the opposite direction from the position located below the robot hand section 14*d* (position P) to the cutting metal die 14*b* (position R) at the same time.

When they meet each other on the way, one of them moves upward (position Q) and the other moves downward (position S) to avoid collision.

In this way, the first shuttle 14*f* and the second shuttle 14*h* synchronously moves on the same straight path without collision. Therefore, the operation of moving separated transistors 1 from the cutting metal die section 14*b* to a position located below the robot hand section 14*d* is conducted very efficiently in the hoop-adapting sorting system 24.

Thereafter, as shown in FIG. 12, the transistors 1 in the first shuttle 14*f* or the second shuttle 14*h* are picked up by the robot hand section 14*d* by means of vacuum suction and moved onto the shutter section 14*e* shown in FIG. 13.

During this moving operation, the transistors 1 (six transistors as shown in FIG. 12 in the case of the first embodiment) of one row running along the tape-shaped frame 6 out of the transistors 1 contained in the pockets 14*g* of the first shuttle 14*f* or the pockets 14*i* of the second shuttle 14*h* that are arranged in the form of a matrix are sucked and held by the robot hand section 14*d*, and the robot hand section 14*d* is turned by 90° to turn the direction of arrangement of the six transistors 1 also by 90°. Then, the robot hand section 14*d* is stopped in such a way that the transistors 1 it carries are arranged in a line parallel to the shutter section 14*e* located at an end of the straight linear feeder section 17.

In this way, a total of six transistors 1 are moved from the tape-shaped frame 6 carrying transistors 1 in 4 rows to the linear feeder section 17 by a single operation of the robot hand section 14*d*.

Therefore, the hoop-adapting supply section 14 of the hoop-adapting sorting system 24 of the first embodiment can efficiently supply transistors 1 to the sorting section 12 to realize a very high throughput.

The separation of the six transistors 1 from the robot hand section 14*d* is realized by stopping the suction by vacuum of the transistors 1 by means of the robot hand section 14*d*. At the same time, the front end of the robot hand section 14*d* is blocked by the shutter section 14*e* at a position above the corresponding end of the linear feeder 17 as shown in FIG. 13 so that the six transistors 1 are separated from the robot hand section 14*d* and placed at the end of the straight linear feeder section 17 in an aligned manner.

Subsequently, the aligned transistors 1 on the linear feeder section 17 are supplied to the sorting section 12 one by one due to the vibration of the linear feeder section 17.

Note that the hoop-adapting sorting system 24 of the first embodiment is so designed that the capacity of supplying semiconductor devices (processing capacity) from the hoop-adapting supply section 14 to the sorting section 12 is by far greater than the sorting capacity of the sorting section 12.

This is because the cost of the sorting section 12 is by far higher than the cost of the hoop-adapting supply section 14 and hence the sorting section 12 should not remain idle even for a short period of time. Thus, the hoop-adapting supply section 14 is made to be able to supply semiconductor devices to the sorting section 12 at a high rate.

More specifically, a total of 24 sealed elements are cut and separated by the cutting metal die section 14*b* of the hoop-adapting supply section 14 and the first shuttle 14*f* and the second shuttle 14*h* are used to reciprocate simultaneously. Additionally, the robot hand section 14*d* is made to be able to turn by 90°. By so doing, the transistors 1 are supplied to the sorting section 12 at a high throughput.

However, since the capacity of the hoop-adapting supply section 14 is by far larger than that of the sorting section 12, there may appear a phenomenon where transistors 1 are overflowing from the linear feeder section 17. Therefore, the linear feeder section 17 of the hoop-adapting sorting system 24 is provided on the midway thereof with a sensor 17*a* that detects the overflowing of transistors as shown in FIG. 14.

More specifically, the sensor 17*a* arranged on the midway of the linear feeder section 17 detects the presence of a transistor 1 or the quantity (number) of transistors 1 in a predetermined area of the linear feeder section 17 and feeds back the information obtained by the detecting operation to the hoop-adapting supply section 14. With such a constitution, the transistors 1 can be individually supplied to the sorting section 12 while controlling the rate of the transistors 1 supplied from the hoop-adapting supply section 14.

When the sensor 17*a* detects a transistor 1 at a predetermined position on the midway of the linear feeder section 17, it feeds back its finding to the hoop-adapting supply section 14 so as to temporarily stop the supply of transistors 1 to the sorting section 12.

When the sensor 17*a* no longer detects any transistor 1 at the predetermined position on the midway of the linear feeder section 17, the supply of transistors 1 from the hoop-adapting supply section 14 to the sorting section 12 is resumed.

With this arrangement, any trouble in the operation of the hoop-adapting supply section 14 can be prevented from taking place when the linear feeder section 17 is overflowing with transistors 1, and the sorting section 12 can continue its sorting operation without any unnecessary pauses.

Then, each of the transistors 1 fed to the sorting section 12 is tested for its electric performance by the sorting head 12*d*.

More specifically, measuring mechanism 22 is brought to contact the leads 2 of each transistor 1 to test the same as shown in FIG. 20.

Then, the defect classifying head 12*e* classifies defective transistors 1 on the basis of the outcome of the performance test.

Additionally, the orientation head 12*f* directs good transistors 1 in the same direction for transportation, and the appearance examination head 12*g* examines the appearance of each transistor 1.

The transistors 1 that are determined to be good ones are taped by the taping head 12*h* as shown in FIG. 21. More specifically, each good transistor 1 is contained in a receiving section 12*l* of a shipping tape 12*i* by the taping head 12*h*.

Now, a semiconductor device sorting system in which a sorting section 12 and a frame-adapting supply section 15 are linked will be described below.

Such a semiconductor device sorting system is used when a strip-shaped frame 8 as shown in FIG. 8 is supplied to the frame-adapting supply section 15. The frame-adapting supply section 15 is provided with a frame supply loader section 15*a* as shown in FIG. 2. For the sorting step, a rack 15*b* carrying strip-shaped frames 8 as shown in FIG. 1 is set in the frame supply loader section 15*a* and a strip-shaped frame 8 is taken out from the rack 15*b* and moved onto the cutting metal die section 14*b* so that the leads in the strip-shaped frame 8 may be cut in the same manner as the hoop-adapting sorting system 24.

Thereafter, the separated transistors 1 are moved to the sorting section 12 by way of the linear feeder section 17 and sorted based on the performance test by the sorting section 12.

As described above, in the semiconductor device manufacturing method according to the first embodiment of the present invention, a supply section of any different types adapted to respective supply types of transistor parts (such as a tape-shaped frame 6 and a strip-shaped frame 8 in the first embodiment) can be attached and replaced to the sorting section 12 when sorting the transistors 1 based on the performance test by the sorting section 1 of the semiconductor device sorting system. The supply section is adapted to separate transistors from a transistor carrying complex, which may be a tape-shaped frame 6 or a strip-shaped frame 8, and feed the separated transistors 1 to the sorting section 12.

With this arrangement, transistors 1 of a type can be easily switched to those of another type.

Additionally, the costly sorting section 12 (sorting apparatus) is commonly used for all the supply sections, and only the less costly supply sections are replaced, which makes it possible to reduce the cost of sorting the transistors 1 in the sorting step when various types of the transistors 1 are sorted in order to deal with the changes of a product type.

Still additionally, since the sorting section 12 is commonly used, the space required for sorting transistors of various different types can be minimized, and thus, the efficient use of the space can be achieved.

Furthermore, in the semiconductor device sorting system according to the first embodiment of the present invention, the capacity of supplying semiconductor devices (processing capacity) from the hoop-adapting supply section 14 or the frame-adapting supply section 15 to the sorting section 12 is made much higher than the capacity of the sorting section 12 and therefore the sorting section 12 is prevented from remaining idle even for a short period of time.

In other words, a total of 24 transistors 1 are cut and separated collectively by the cutting metal die section 14*b* of the frame-adapting supply section 14 or the frame-adapting supply section 15, and the first shuttle 14*f* and the second shuttle 14*h* are used and made to reciprocate at the same time for moving transistors, and further, the robot hand section 14*d* is so arranged as to be turned by 90° when supplying transistors 1 to the sorting section 12. With such a constitution, the transistors 1 are supplied to the sorting section 12 with the high throughput.

Thus, this embodiment can adapt itself to supplying various different types of transistor parts and realize a high throughput in the sorting step of the various types of the transistor parts.

Additionally, the supply section such as a hoop-adapting supply section 14 or a frame-adapting supply section 15 is supplied not with separated individual transistor parts but with one or more complexes containing such transistors, which makes it possible to facilitate the operation of handing transistor parts resulting that the workability in the sorting step can be improved.

Still additionally, since no bowl parts feeder such as the one described in Japanese Patent Application No. 8-86833 is used, it is now possible to prevent the problem that the marks applied to the surfaces of sealed elements of transistors 1 are erased and/or the leads 2 are deformed as they contact with the inner peripheral surface of the bowl parts feeder.

Still additionally, since no bowl parts feeder is used, the time required for supplying transistors 1 from the supply section such as the hoop-adapting supply section 14 or the frame-adapting supply section 15 to the sorting section 12 can be reduced, which makes it possible to improve the throughput of the sorting step.

Furthermore, the installation area per unit capacity of the supply sections such as the hoop-adapting supply section 14 and the frame-adapting supply section 15 of the semiconductor device sorting system can be reduced to save space for the semiconductor device sorting system by collectively cutting a total of 24 transistors at a time by means of the cutting metal die section 14 of the supply section, by making the first shuttle 14*f* and the second shuttle 14*h* to reciprocate in a concerted manner and transport transistors, and by causing the robot hand section 14*d* to move and turn by 90° in a manner as described above.

Finally, the semiconductor device sorting system of the first embodiment is effectively used as a sequential processing devices performing the steps of cutting and separating semiconductor devices from a complex carrying them (cutting the leads), testing the performance of them to sort the same, and taping good devices. Thus, the use of such a sequential processing device can reduce the space required for the semiconductor device sorting system.

(Second Embodiment)

Figure 22:
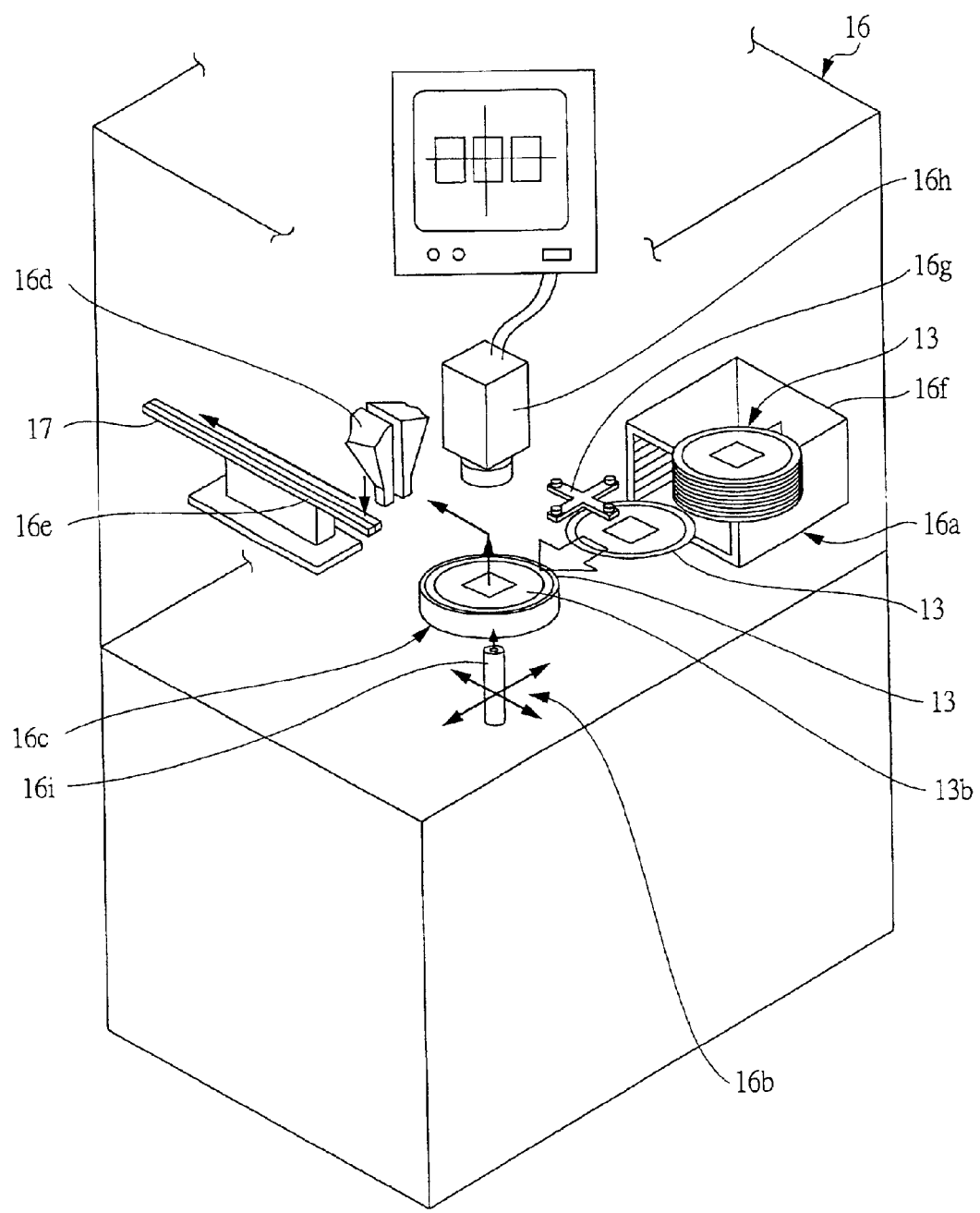
FIG. 22 is a schematic perspective view of the supply section of the semiconductor device sorting system according to the second embodiment of the present invention, which illustrates an example of the structure thereof.
Figure 25:
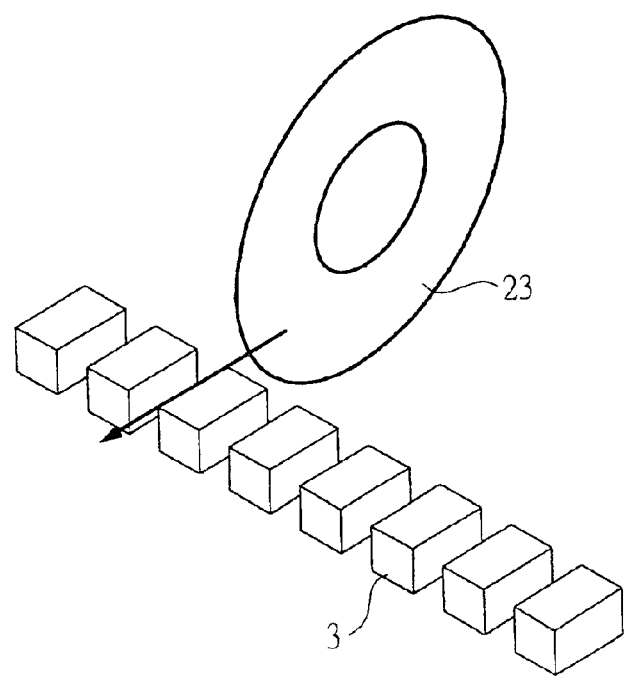
FIG. 25 is a schematic perspective view of some of the sealed elements attached to the ring member of FIG. 23, which illustrates an example of a dicing operation to be used for separating the sealed elements.
Figure 26:
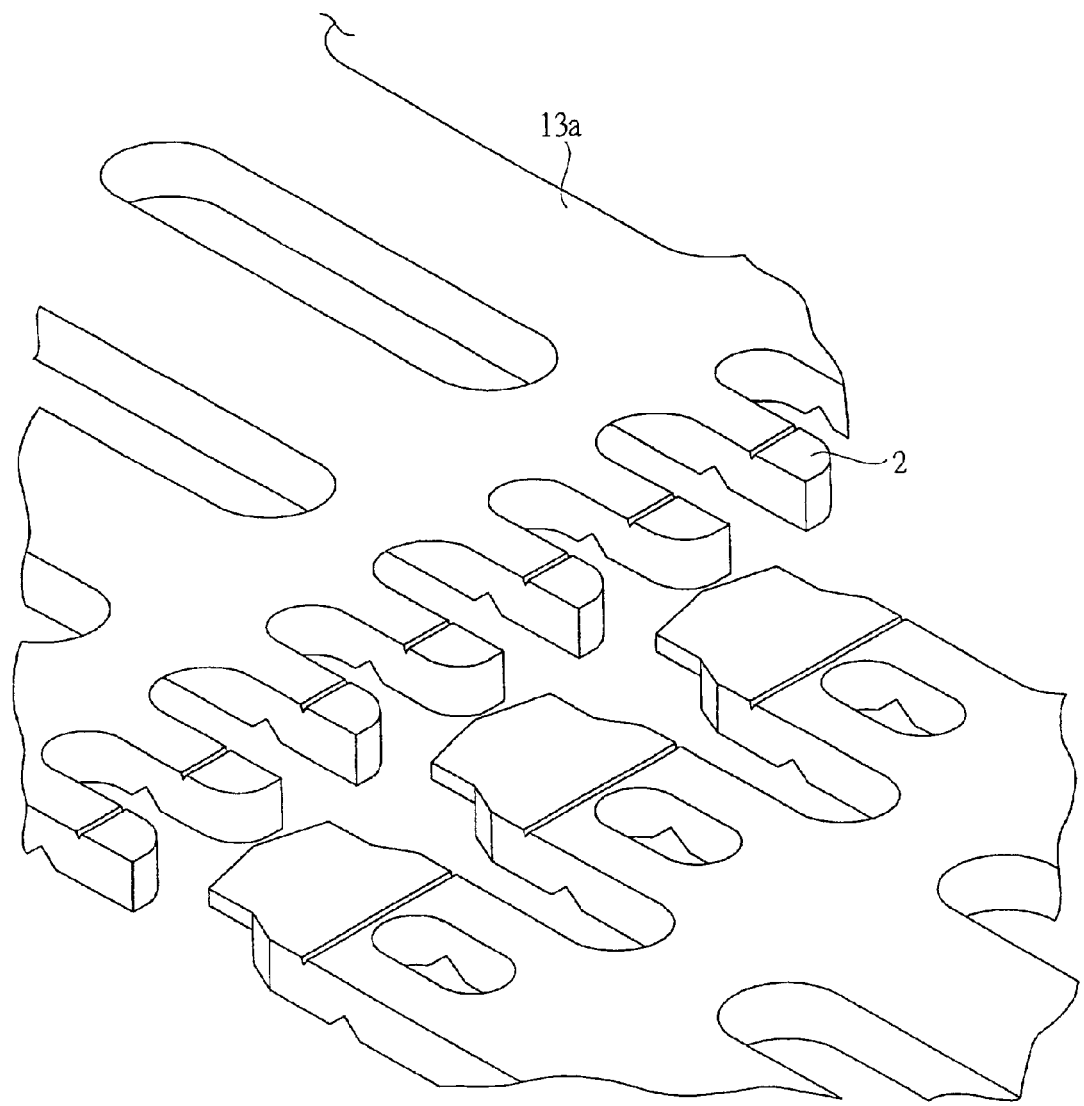
FIG. 26 is a schematic partial perspective view of a frame used in the semiconductor device manufacturing method according to the second embodiment of the present invention, which illustrates an example of the frame preparation step thereof.
Figure 27:
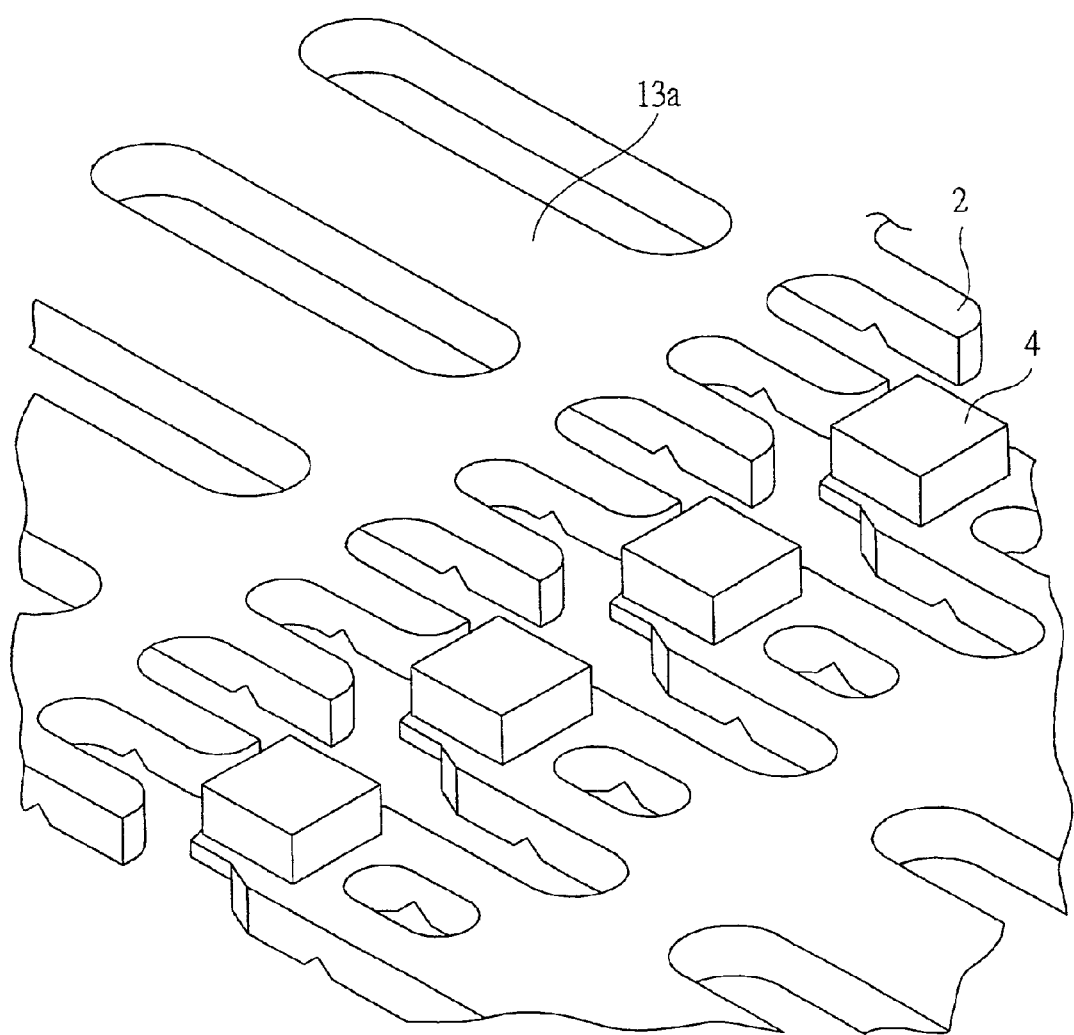
FIG. 27 is a schematic partial perspective view of a frame used in the semiconductor device manufacturing method according to the second embodiment of the present invention, which illustrates an example of the pellet attaching step thereof.
Figure 28:
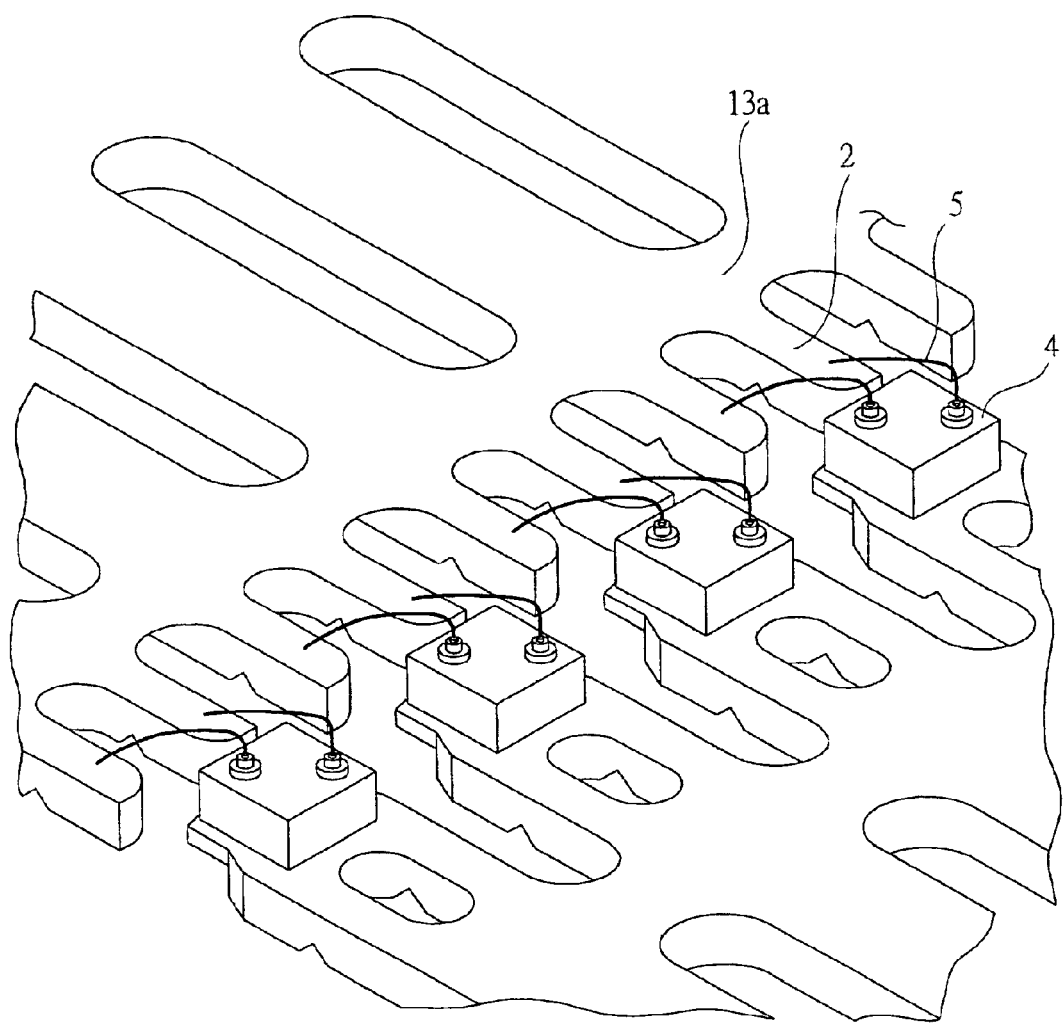
FIG. 28 is a schematic partial perspective view of a frame used in the semiconductor device manufacturing method according to the second embodiment of the present invention, which illustrates an example of the wire bonding step thereof.
Figure 29:
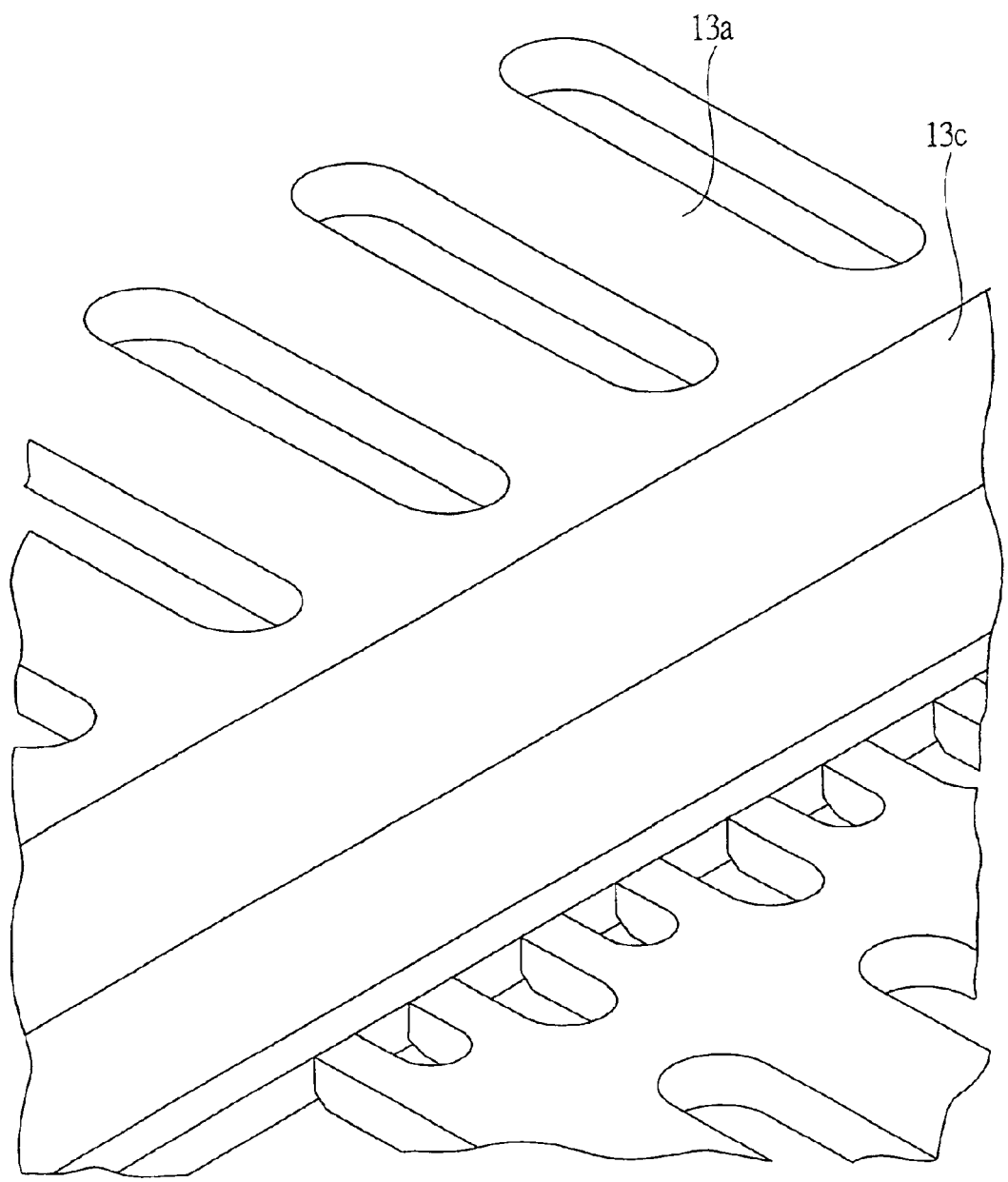
FIG. 29 is a schematic partial perspective view of a frame used in the semiconductor device manufacturing method according to the second embodiment of the present invention, which illustrates an example of the molding step thereof.
Figure 30:
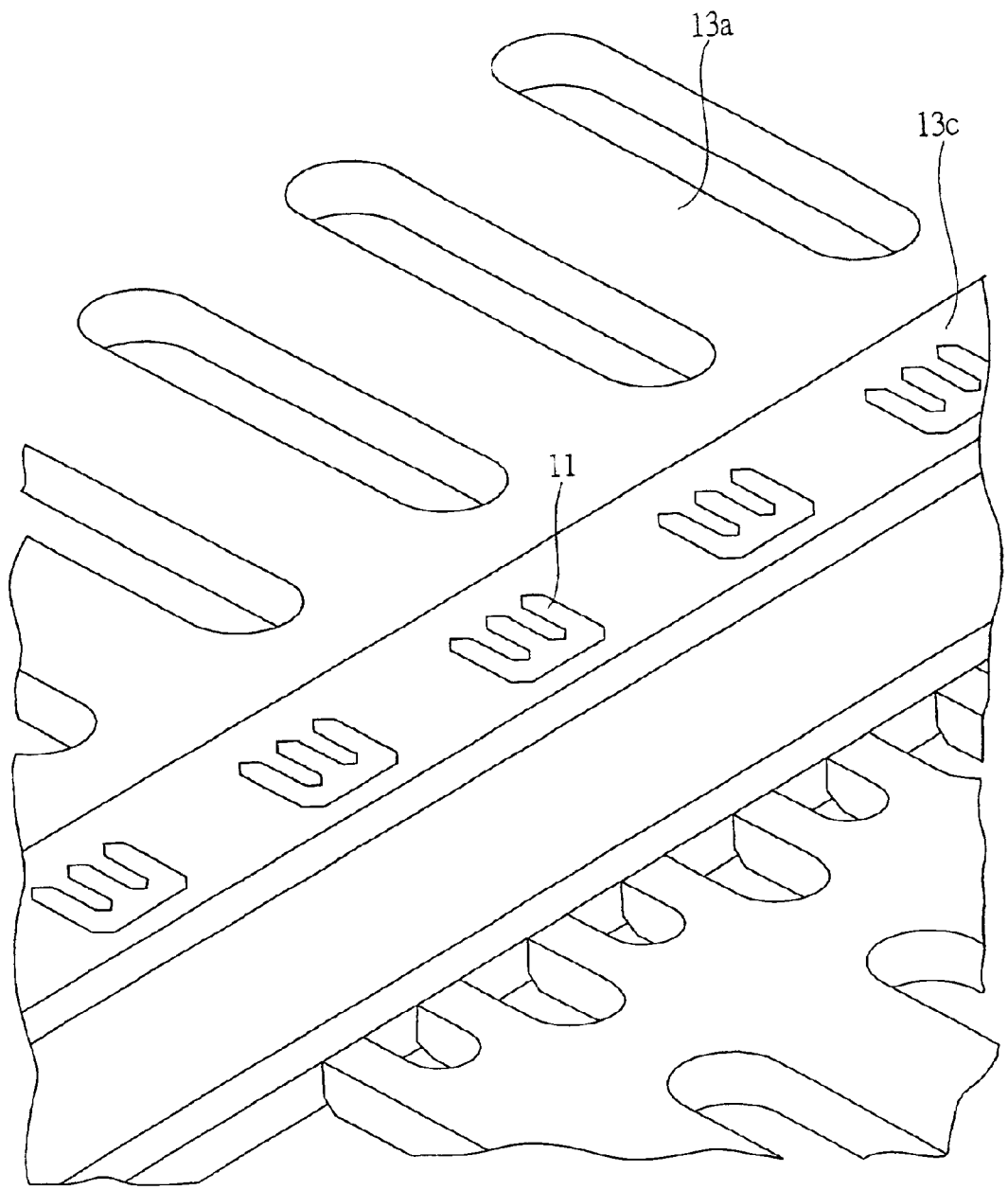
FIG. 30 is a schematic partial perspective view of a frame used in the semiconductor device manufacturing method according to the second embodiment of the present invention, which illustrates an example of the marking step thereof.
Figure 31:
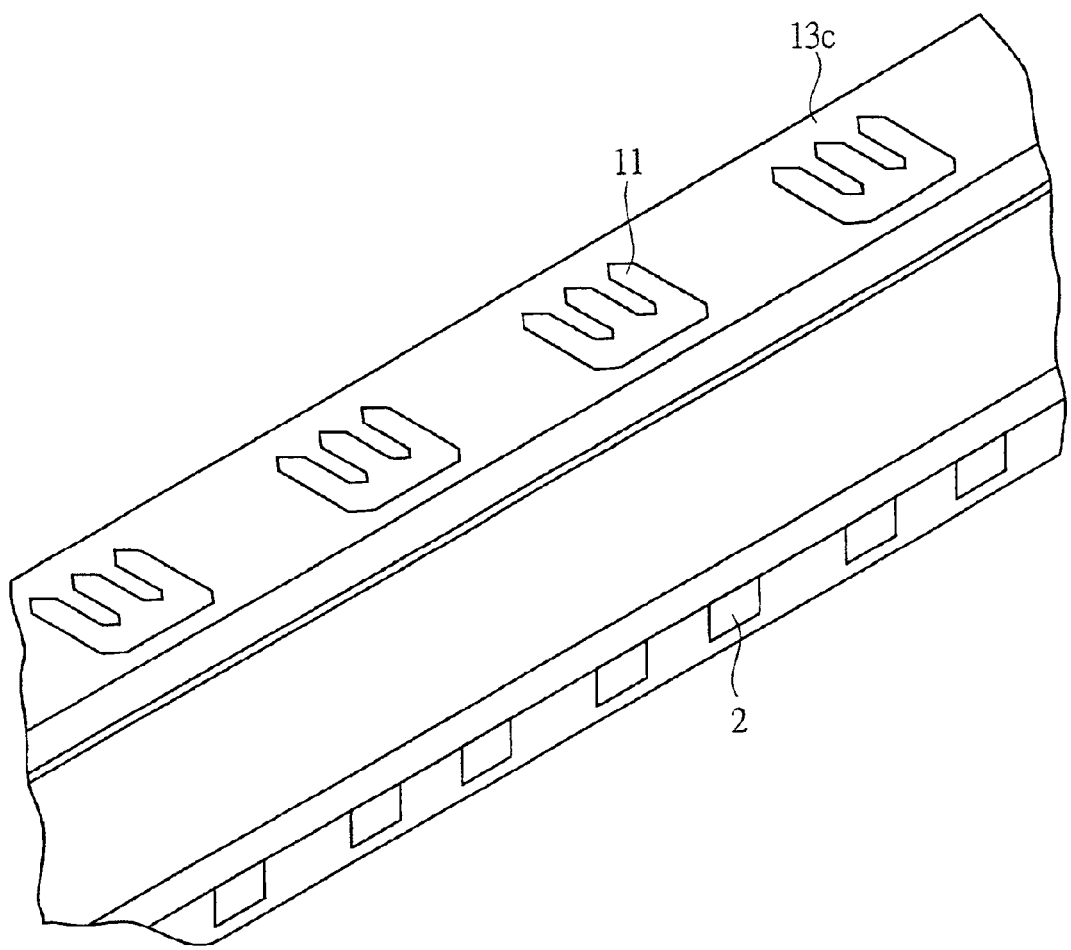
FIG. 31 is a schematic partial perspective view of a frame used in the semiconductor device manufacturing method according to the second embodiment of the present invention, which illustrates an example of the lead cutting step thereof.
Figure 32:
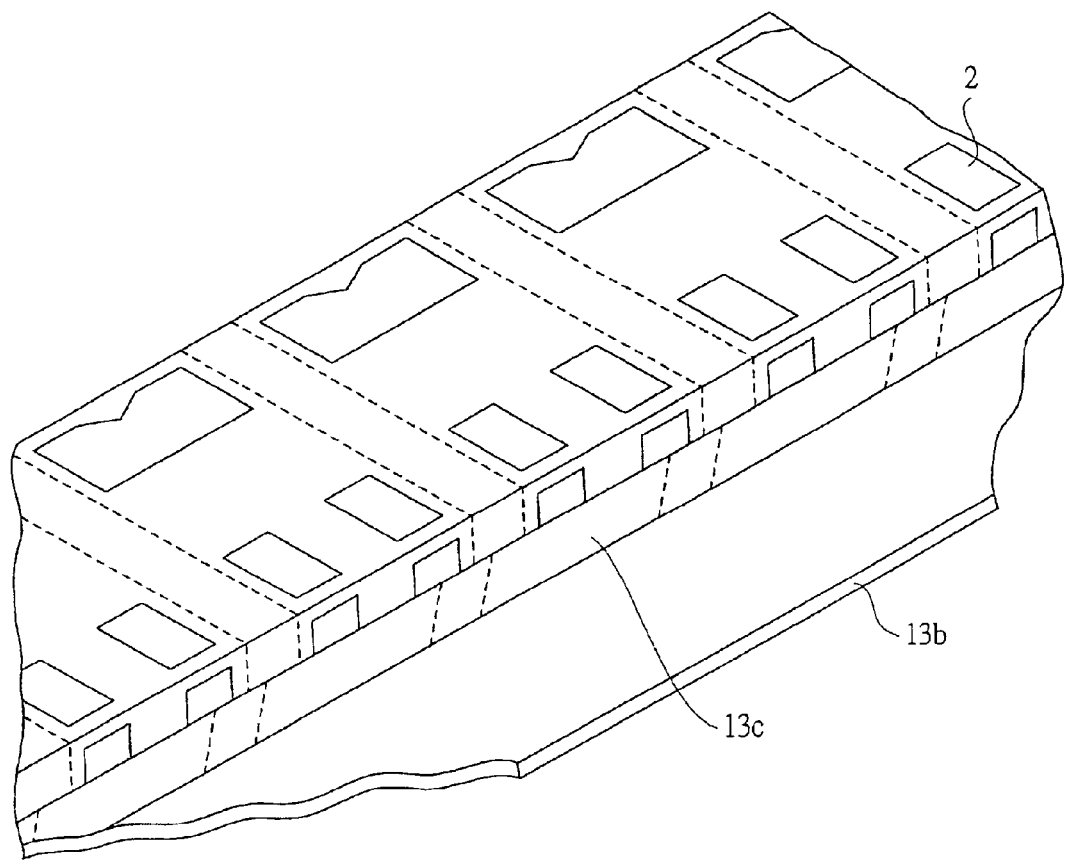
FIG. 32 is a schematic partial perspective view of a frame used in the semiconductor device manufacturing method according to the second embodiment of the present invention, which illustrates an example of the tape applying step thereof.

FIG. 22 is a schematic perspective view of the supply section of the semiconductor device sorting system according to the second embodiment of the present invention, which illustrates an example of the structure thereof. FIG. 23 is a schematic plan view of a ring member used in the semiconductor device manufacturing method according to the second embodiment of the present invention, which illustrates an example of the structure thereof. FIG. 24 is a schematic partial plan view of the ring member of FIG. 23, which illustrates the structures of some of the sealed elements attached to the ring member. FIG. 25 is a schematic perspective view of some of the sealed elements attached to the ring member of FIG. 23, which illustrates an example of a dicing operation to be used for separating the sealed elements. FIG. 26 is a schematic partial perspective view of a frame used in the semiconductor device manufacturing method according to the second embodiment of the present invention, which illustrates an example of the frame preparation step thereof. FIG. 27 is a schematic partial perspective view of a frame used in the semiconductor device manufacturing method according to the second embodiment of the present invention, which illustrates an example of the pellet attaching step thereof. FIG. 28 is a schematic partial perspective view of a frame used in the semiconductor device manufacturing method according to the second embodiment of the present invention, which illustrates an example of the wire bonding step thereof. FIG. 29 is a schematic partial perspective view of a frame used in the semiconductor device manufacturing method according to the second embodiment of the present invention, which illustrates an example of the molding step thereof. FIG. 30 is a schematic partial perspective view of a frame used in the semiconductor device manufacturing method according to the second embodiment of the present invention, which illustrates an example of the marking step thereof. FIG. 31 is a schematic partial perspective view of a frame used in the semiconductor device manufacturing method according to the second embodiment of the present invention, which illustrates an example of the lead cutting step thereof. FIG. 32 is a schematic partial perspective view of a frame used in the semiconductor device manufacturing method according to the second embodiment of the present invention, which illustrates an example of the tape applying step thereof. FIG.

Figure 34:
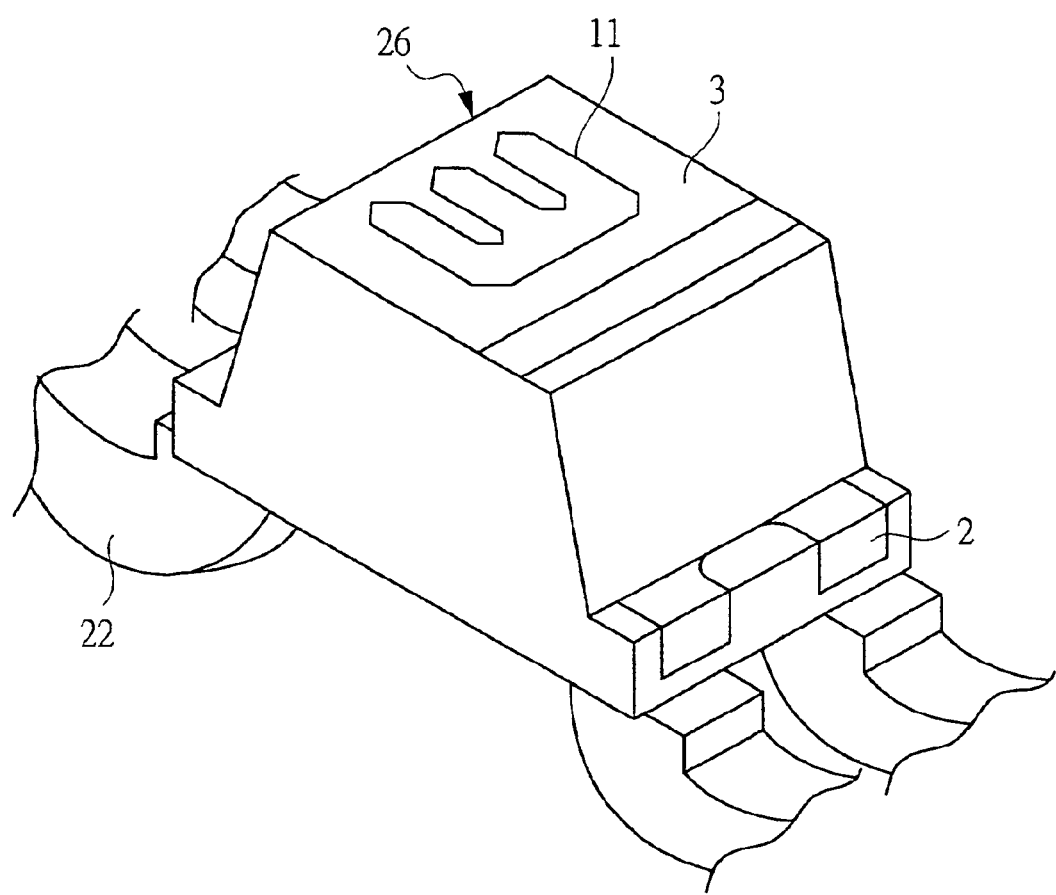
FIG. 34 is a schematic partial perspective view of a frame used in the semiconductor device manufacturing method according to the second embodiment of the present invention, which illustrates an example of the sorting step thereof.
Figure 35:
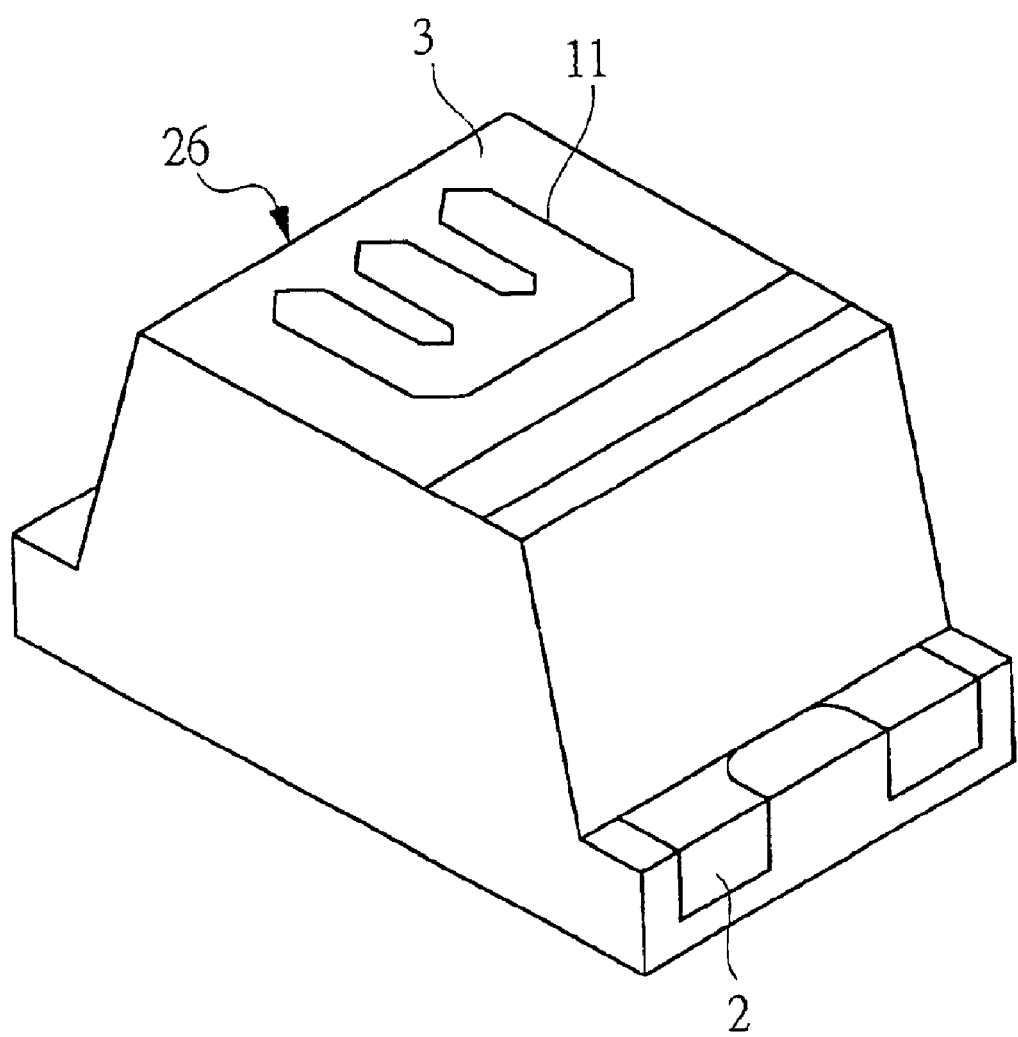
FIG. 35 is a schematic partial perspective view of a semiconductor device that is selected as good one in the sorting step of FIG. 34.
Figure 36:
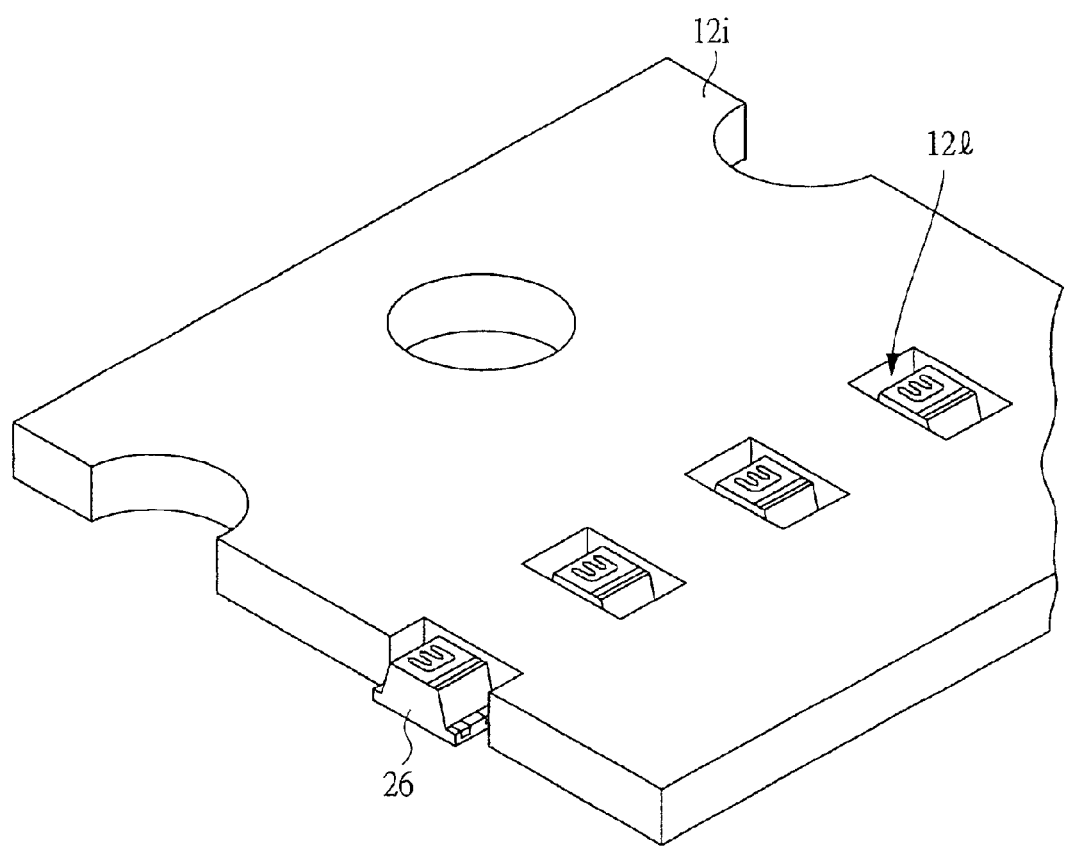
FIG. 36 is a schematic partial perspective view of a frame used in the semiconductor device manufacturing method according to the second embodiment of the present invention, which illustrates an example of the taping step thereof.
Figure 38:
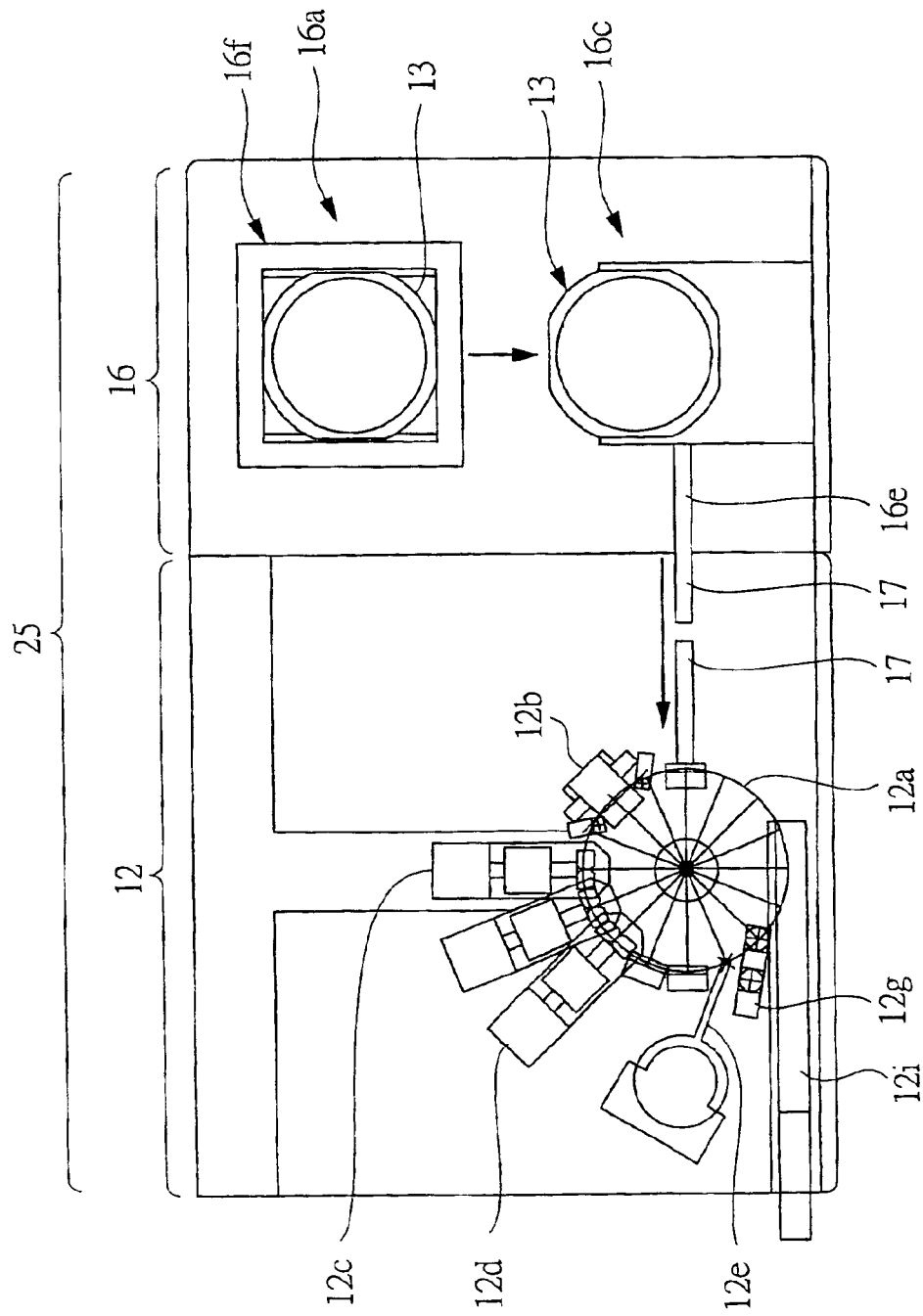
FIG. 38 is a schematic plan view showing an example of a structure of a carrier-ring-adapting sorting system according to the second embodiment of the present invention.

33 is a schematic partial perspective view of a frame used in the semiconductor device manufacturing method according to the second embodiment of the present invention, which illustrates an example of the dicing step thereof. FIG. 34 is a schematic partial perspective view of a frame used in the semiconductor device manufacturing method according to the second embodiment of the present invention, which illustrates an example of the sorting step thereof. FIG. 35 is a schematic partial perspective view of a semiconductor device that is selected as good one in the sorting step of FIG. 34. FIG. 36 is a schematic partial perspective view of a frame used in the semiconductor device manufacturing method according to the second embodiment of the present invention, which illustrates an example of the taping step thereof. FIG. 38 is a schematic plan view showing an example of a structure of a carrier-ring-adapting sorting system according to the second embodiment of the present invention.

In the second embodiment, transistor parts are supplied with a ring member 13 as shown in FIG. 23. Therefore, the semiconductor device sorting system of the second embodiment is a carrier-ring-adapting sorting system 25 shown in FIG. 1 in which a sorting section 12 and a carrier-ring supply section 16 are linked to each other as shown in FIG. 38.

Since the sorting section 12 is same as the sorting section 12 of the hoop-adapting sorting system 24 described above in the first embodiment and thus its configuration and its sorting operation will not be described any further. Thus, the second embodiment will be described in terms of the configuration of the carrier-ring supply section 16 and a method of manufacturing small transistors 26 (whose sealed elements 3 typically have dimensions of about 1.0 mm×0.6 mm) as shown in FIG. 35, using the carrier-ring-adapting sorting system 25.

Firstly, as shown in FIGS. 2 and 22, the carrier-ring supply section 16 is provided with a ring supply section 16a where a carrier cassette 16f containing a plurality of ring members 13 is arranged, an X-Y stage section 16b for moving a push-up section 16i that is adapted to push up separated transistors 26 in X-Y direction, a pickup section 16c where a ring member 13 is arranged so as to be pushed up and picked up, a handling section 16d for picking up the pushed up transistors 26, and a spiral shoot section 16e for moving the transistors 26 brought in by the handling section 16d to a linear feeder section 17 and turning the transistors 26 upside down.

As shown in FIG. 22, the carrier-ring supply section 16 is further provided with a four-point suction pad 16g for sucking and holding a ring member 13 contained in the carrier cassette 16f in the ring supply section 16a at four points, taking it out from the carrier cassette 16f and moving it to the pickup section 16c while it is in the sucked and held condition and an alignment camera 16h for picking up an image of a position of the transistors 26 from above as they are pushed up by the pickup section 16c.

The push-up section 16i is adapted to push up the sealed elements 3 of the transistors 26 on the ring member 13 from the rear side of the adhesive tape 13b of the ring member 13 that is arranged in the pickup section 16c.

The handling section 16d sucks the transistors 26 pushed up by the push-up section 16i by means of vacuum, grasps them, lifts them up and separates them from the adhesive tape 13b.

Now, the method of manufacturing a semiconductor device (transistor 26) of the second embodiment will be described.

Firstly, a support frame 13a having a plurality of leads 2 as shown in FIG. 26 is prepared and subjected to a pellet mounting operation of mounting a plurality of semiconductor pellets 4, each having a transistor circuit, onto the support frame 13a as shown in FIG. 27.

Then, as shown in FIG. 28, a wire bonding operation of electrically connecting the electrodes of each semiconductor pellet 4 and corresponding leads 2 by means of wires 5 is conducted.

Subsequently, a molding operation of sealing each semiconductor pellet 4 and the wires 5 by means of sealing resin is conducted.

As a result, a collective sealed section 13c that corresponds to a plurality of transistor parts is formed on the support frame 13a as shown in FIG. 29.

Then, as shown in FIG. 30, the collective sealed section 13c is subjected to a marking operation of putting a mark 11 to the surface of a region corresponding to each transistor parts. The mark 11 typically carries signs indicating the type of product and so on. A technique of laser marking using a YAG laser or a $CO_2$ laser may typically be used for the marking operation.

Thereafter, the leads of the collective sealed section 13c are cut.

Then, as shown in FIG. 32, an adhesive tape 13b is applied to the surface of the collective sealed section 13c with the connecting surfaces of the leads 2 facing upward.

As shown in FIG. 23, the adhesive tape 13b is supported along the periphery thereof by a ring member 13.

More specifically, on the support frame 13a where collective sealed sections 13c are arranged in rows, a mounting surface of the collective sealed section 13c is made to face upward and the adhesive tape 13b is bonded to the other surface.

Figure 33:
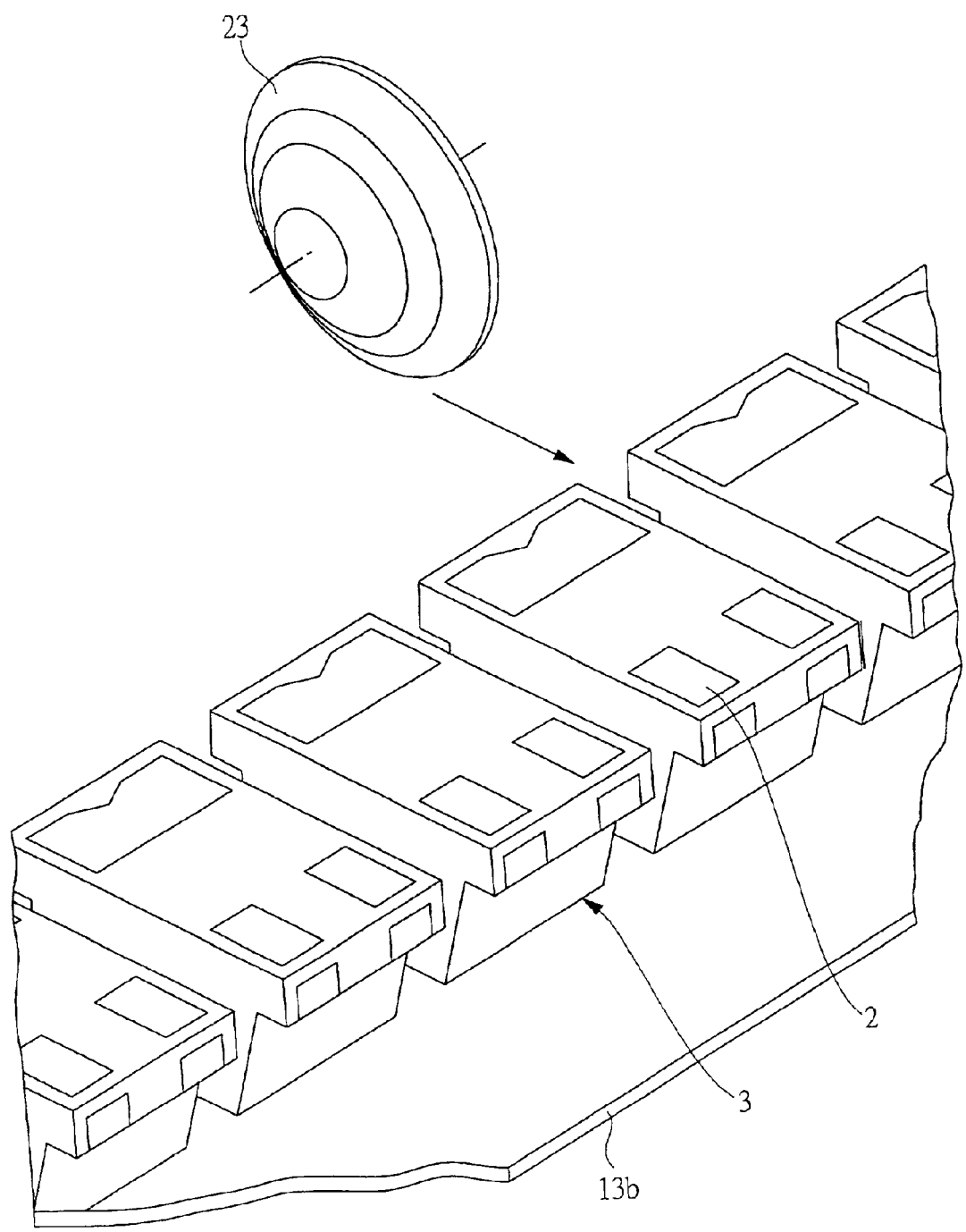
FIG. 33 is a schematic partial perspective view of a frame used in the semiconductor device manufacturing method according to the second embodiment of the present invention, which illustrates an example of the dicing step thereof.

Subsequently, as shown in FIGS. 25 and 33, the collective sealed section 13c is subjected to a dicing operation of cutting it into individual transistors 26 by means of a dicing blade 23.

Note that the dicing operation mentioned here is a half dicing operation in which the resin part and about a half of the adhesive tape 13b are cut.

Thus, after the dicing operation (see FIG. 33), the individual transistors are separated from the support frame 13a but not completely separated from each other because they are still bonded to the adhesive tape 13b on the ring member 13 and the adhesive tape 13b is not completely cut into pieces. FIG. 23 shows this condition.

Thereafter, the carrier-ring-adapting sorting system 25 shown in FIG. 38 and composed of the carrier-ring supply section 16 and the sorting section 12 shown in FIG. 1 is used to test the performance of each of the transistors 26 and sort them.

Firstly, ring members 13 each of which is a complex as shown in FIG. 23 and supports an adhesive tape 13b to which a plurality of sealed elements 3 having respective semiconductor pellets 4 are bonded are prepared.

Then, a carrier cassette 16f containing a plurality of (e. g., about 25) ring members 13 is set in the ring supply section 16a of the carrier-ring supply section 16 of the carrier-ring-adapting sorting system 25 as shown in FIG. 22.

Thereafter, a ring member 13 is sucked and held at four points by the four-point suction pad 16g and taken out of the carrier cassette 16f in this condition. Then, the ring member 13 that is sucked and held by the four-point suction pad 16g is moved to the pickup section 16c.

This operation of transferring the ring member 13 sucked and held at four points by the four-point suction pad 16g to the pickup section 16c can be conducted in a very stable state because the ring member 13 is sucked and held at four points.

Subsequently, the push-up section 16i (also referred to as needle) is moved by the X-Y stage section 16b at the pickup section 16c in order to push up the sealed elements 3 of the transistors 26 from the rear side of the adhesive tape 13b of the ring member 13.

Then, the sealed elements 3 of the pushed up transistors 26 are grasped by the handling section 16d and lifted up (picked up) by means of vacuum suction with the mounting surfaces of the sealed elements 3 of the transistors 26 facing upward. As a result, the transistors 26 are separated from the adhesive tape 13b, then finishing the separating operation.

Note that a coordinate adjustment operation is conducted by means of the alignment camera 16h when the transistors 26 are picked up.

Thereafter, the transistors 26 are delivered by the handling section 16d to the spiral shoot section 16c connected to an end of the linear feeder section 17.

Then, the separated transistors 26 are aligned by the linear feeder section 17 by way of the spiral shoot section 16e and fed to the sorting section 12 on a one by one basis.

At this time, each transistor 26 is spirally moved in the spiral shoot section 16e serving also as a parts feeder and turned upside down before it is supplied to the sorting section 12 with the surface opposite to the mounting surface facing upward.

Thereafter, each transistor 26 is sorted based on the electric performance test by the sorting section 12 in the same manner as the first embodiment.

Since the sealed elements 3 of transistors 26 are transported to the sorting section 12 with their mounting surfaces facing downward, the measuring mechanism 22 is brought to contact with the connection surfaces of the leads 2 of each transistor 26, and then, the electric performance test is conducted as shown in FIG. 34.

Then, the tested transistors are classified on the bases of the outcome of the performance test and good transistors are directed in the same direction for transportation. Then, the appearance of each transistor is examined.

The transistors 26 shown in FIG. 35 that are determined to be good ones are taped in a manner as shown in FIG. 36. More specifically, each good transistor 26 is contained in a receiving section 12l of a shipping tape 12i.

Similar to the semiconductor device sorting system of the first embodiment, in the carrier-ring-adapting sorting system 25 of the second embodiment, a supply section of any of a plurality of different types adapted to respective types of supplying transistor parts to the sorting section 12 (the ring member 13 in the second embodiment) can be attached and replaced when sorting the transistors 26 based on the performance test by the sorting section 12 of the semiconductor device sorting system. The supply section 12 is adapted to separate transistors from a transistor carrying complex, which may bearing member 13, and feed these separated transistors 26 to the sorting section 12.

Also with this arrangement of the carrier-ring-adapting sorting system 25, transistors 26 of a type can be easily switched to those of another type.

Additionally, similar to the case of the hoop-adapting sorting system 24 of the first embodiment, since the sorting section 12 is commonly used in the sorting of the various types of transistors, the cost of sorting transistors in the sorting step can be remarkably reduced, and the space required for sorting transistors of various different types can be minimized, and thus, the efficient use of the space can be achieved.

Finally, like the hoop-adapting sorting system 24, the carrier-ring-adapting sorting system 25 is effectively used as a sequential processing semiconductor device performing the steps of cutting and separating semiconductor devices from a complex carrying them (cutting the leads), testing the performances of then to sort the same, and taping good devices. Thus, the use of such a sequential processing device can reduce the space required for the semiconductor device sorting system.

In the foregoing, the present invention made by the inventors thereof has been described in detail based on the first and second embodiments. However, the present invention is by no means limited to the first and second embodiments, and it can be modified in various different ways without departing from the scope of the present invention.

For example, the semiconductor devices (transistors 1) that are described in the first embodiment are provided with flat leads 2. However, the present invention is also adapted to deal with transistors 1 having gull-wing-shaped leads 2 produced by way of a bending process.

Furthermore, the first and second embodiments are described above in terms of semiconductor devices that are transistors 1 and 26. However, the semiconductor devices may be diodes.

The present invention disclosed in this application provides a number of advantages, and typical ones of them will be briefly described as follows.

Since various types of supply sections capable of dealing with various supply forms can be selectively attached to and replaced from a sorting section performing the sorting operation, semiconductor devices of a type can be easily switched to those of another type in the sorting step.

What is claimed is:

1. A semiconductor device manufacturing method comprising:
   (a) a step of preparing complexes, each having a plurality of sealed elements having a semiconductor pellet and a link member for linking said sealed elements; and
   (b) a step of providing a plurality of supply sources corresponding to different types of semiconductor devices and sequentially processing the complexes supplied from any selected one of said plurality of supply sources.

2. A semiconductor device manufacturing method comprising:
   (a) a step of preparing complexes, each having a plurality of sealed elements having a semiconductor pellet and a link member for linking said sealed elements;
   (b) a step of linking any selected one of a plurality of supply sections corresponding to different types of semiconductor devices to a sorting section capable of liking to one of said plurality of supply sections, and separating said sealed elements of each of the complexes taken in from a supply source corresponding to the selected supply section, said complexes having a form specific to the selected supply section; and
   (c) a step of sorting the separated semiconductor devices in said sorting section.

3. The semiconductor device manufacturing method according to claim 1, wherein
   each of said complexes in said supply source has a form of a tape-shaped frame carrying a plurality of sealed elements arranged consecutively at predetermined regular intervals, a form of a ring member supporting an adhesive tape bonded to a plurality of sealed elements, or a form of a strip-shaped frame carrying a plurality of sealed elements arranged consecutively at predetermined regular intervals.

4. The semiconductor device manufacturing method according to claim 1, wherein
said sequential processing of the complexes includes the steps of separating the semiconductor devices of each of said complexes and sorting said separated semiconductor devices.

5. The semiconductor device manufacturing method according to claim 1, wherein
said sequential processing of the complexes includes the steps of separating the sealed elements of each of said complexes, sorting the separated semiconductor devices by means of the performance test, and taping good ones.

6. A semiconductor device manufacturing method comprising:
(a) a step of preparing tape-shaped frames of complexes, each having a plurality of sealed elements having a semiconductor pellet and a link member for linking said sealed elements, said plurality of sealed elements of each complex being arranged consecutively at predetermined regular intervals;
(b) a step of setting a reel carrying said tape-shaped frame wound around it in a supply section, supplying said tape-shaped frame from said reel, and then, separating said sealed elements from said tape-shaped frame in said supply section; and
(c) a step of supplying the separated semiconductor devices from said supply section to a sorting section, and then, sorting said semiconductor devices by means of a performance test in said sorting section.

7. A semiconductor device manufacturing method comprising:
(a) a step of preparing tape-shaped frames of complexes, each having a plurality of sealed elements having a semiconductor pellet and a link member for linking said sealed elements, said plurality of sealed elements of each complex being arranged consecutively at predetermined regular intervals;
(b) a step of setting a reel carrying said tape-shaped frame wound around it in a supply section, supplying said tape-shaped frame from said reel, and then, separating said sealed elements from said tape-shaped frame in said supply section;
(c) a step of aligning the separated semiconductor devices linearly on a straight parts feeder and supplying linearly said aligned semiconductor devices to a sorting section on by one by means of said parts feeder; and
(d) a step of sorting said semiconductor devices by means of a performance test in said sorting section.

8. The semiconductor device manufacturing method according to claim 7, wherein
a given number of sealed elements arranged in the form of a matrix of a plurality of rows and a plurality of columns are collectively cut and separated by means of a cutting metal die when separating sealed elements from said tape-shaped frame in said step (b), said tape-shaped frame carrying a plurality of sealed elements arranged in rows along itself.

9. The semiconductor device manufacturing method according to claim 8, wherein
in said step (b), the collectively cut semiconductor devices are received in respective recesses of a conveyor having the recesses arranged in a matrix of a plurality of rows and a plurality of columns so as to correspond to said matrix of a plurality of rows and a plurality of columns.

10. The semiconductor device manufacturing method according to claim 7, wherein
said collectively cutting operation in step (b) is an operation of cutting and separating sealed elements arranged in the form of a matrix of 4 rows and 6 columns, and the cut and separated sealed elements are received in the respective recesses arranged in 4 rows and 6 columns of the conveyor.

11. The semiconductor device manufacturing method according to claim 7, wherein
said collectively cutting operation in step (b) is an operation of cutting and separating sealed elements by means of a cutting punch arranged in the form of a matrix of a plurality of rows and a plurality of columns, while sucking the sealed elements by vacuum, and then, the collectively cut semiconductor devices are received in respective recesses of a conveyor having the recesses arranged in a plurality of rows and a plurality of columns corresponding to said matrix of a plurality of rows and a plurality of columns, while continuously sucking the sealed elements by vacuum by means of said cutting punch.

12. The semiconductor device manufacturing method according to claim 11, wherein
in said step (b), said sealed elements are cut and separated by said cutting punch, while sucking the sealed elements by vacuum by means of said cutting punch, and then, the front ends of said cutting punch are driven to enter the respective recesses of said conveyor, while continuously sucking the sealed elements by vacuum by means of said cutting punch, and then, stopping said suction by vacuum of said cutting punch so as to make the separated semiconductor devices to be received in the respective recesses of said conveyor.

13. The semiconductor device manufacturing method according to claim 12, wherein
in said step (b), after the cutting operation and the front ends of said cutting punch are driven to enter the respective recesses of said conveyor, while continuously sucking the sealed elements by vacuum by means of said cutting punch, the suction by vacuum of said cutting punch is stopped and, at the same time, the separated semiconductor devices are sucked by vacuum toward the respective recesses of the conveyor so as to make the semiconductor devices to be received in the respective recesses of said conveyor.

14. The semiconductor device manufacturing method according to claim 7, wherein
the semiconductor devices of a row running along the tape-shaped frame are sucked by means of a robot hand section out of the semiconductor devices received in the respective recesses arranged in the form of a matrix in the conveyor in said step (b), and then, said robot hand section is turned by 90° to change the direction of arrangement of said sucked and held semiconductor devices by 90° so as to deliver the semiconductor devices on said straight parts feeder in a direction parallel to the direction of said parts feeder of said step (c).

15. The semiconductor device manufacturing method according to claim 14, wherein
two conveyors are provided, and said two conveyors containing the semiconductor devices cut and separated in said step (b) are driven to reciprocate alternately.

16. The semiconductor device manufacturing method according to claim 15, wherein said two conveyors are driven to reciprocate synchronously in such a way that, while one of them is moving forward, the other is moving backward on the same path and, when the two conveyors meet each other, one of them is moved upward while the other is moved downward in a concerted manner in order to avoid collision.

17. A semiconductor device manufacturing method comprising:
(a) a step of preparing strip-shaped frames of complexes, each having a plurality of sealed elements having a semiconductor pellet and a link member for linking said sealed elements, said plurality of sealed elements of each complex being arranged at predetermined regular intervals;
(b) a step of supplying said strip-shaped frames to a supply section and cutting and separating said sealed elements;
(c) a step of aligning said cut and separated semiconductor devices on a straight parts feeder and supplying said straightly aligned semiconductor devices to a sorting section one by one by means of said parts feeder; and
(d) a step of sorting said semiconductor devices by means of a performance test in said sorting section.

18. A semiconductor device manufacturing method comprising:
(a) a step of preparing ring members, each supporting an adhesive tape to which a plurality of sealed elements having respective a semiconductor pellet are bonded;
(b) a step of supplying said ring member to a supply section, and then, separating said sealed elements from said adhesive tape of said ring member; and
(c) a step of supplying said semiconductor devices separated from said adhesive tape from said supply section to a sorting section, and then, sorting said semiconductor devices by means of a performance test in said sorting section.

19. A semiconductor device manufacturing method comprising:
(a) a step of preparing ring members, each supporting an adhesive tape to which a plurality of sealed elements having respective a semiconductor pellet are bonded;
(b) a step of supplying said ring member to a supply section, and then, separating said sealed elements from said adhesive tape of said ring member; and
(c) a step of aligning said semiconductor devices separated from said adhesive tape on a straight parts feeder, and supplying said straightly aligned semiconductor devices to a sorting section one by one by means of said parts feeder; and
(d) a step of sorting said semiconductor devices by means of a performance test in said sorting section.

20. The semiconductor device manufacturing method according to claim 19, wherein
said ring member is sucked and held at four points and taken out from the container containing said ring member when separating the sealed elements from the adhesive tape of said ring member in said step (b), and then, moved to a pickup section while it is still being sucked and held at four points.

21. The semiconductor device manufacturing method according to claim 19, wherein
said sealed elements are pushed up from the rear surface of said adhesive tape of said ring member in the pickup section of the supply section and picked up by a handling section so as to be separated from said adhesive tape when said sealed elements are separated from the adhesive tape of said ring member in said step (b).

22. The semiconductor device manufacturing method according to claim 21, wherein
said sealed elements are grasped by said handling section and sucked and held by vacuum so as to be separated from said adhesive tape when said sealed elements are picked up by said handling section.

23. The semiconductor device manufacturing method according to claim 19, wherein
said semiconductor devices are spirally moved and turned upside down to make a surface opposite to a mounting surface face upward in said parts feeder, and then, the semiconductor devices are supplied to said sorting section when they are linearly aligned and supplied one by one to the sorting section by said parts feeder in said step (c).

24. A semiconductor device manufacturing method comprising:
(a) a step of preparing a plurality of complexes, each having a plurality of sealed elements having a semiconductor pellet and a link member for linking said sealed elements;
(b) a step of linking any selected one of a plurality of supply sections corresponding to different types of semiconductor devices to a sorting section capable of linking to one of said plurality of supply sections, and separating said sealed elements of each of the complexes taken in from a supply source corresponding to the selected supply section, said complexes having a form specific to the selected supply section; and
(c) a step of sorting the separated semiconductor devices in said sorting section, said sorting section having a processing capacity smaller than the supplying capacity of said supply section.

25. The semiconductor device manufacturing method according to claim 24, wherein
said supply section separates said semiconductor devices of said complex and said sorting section performs an operation of sorting the separated semiconductor devices and an operation of taping good semiconductor devices.

26. A semiconductor device manufacturing method comprising:
(a) a step of preparing a plurality of complexes, each having a plurality of sealed elements having a semiconductor pellet and a link member for linking said sealed elements;
(b) a step of linking any selected one of a plurality of supply sections corresponding to different types of semiconductor devices to a sorting section capable of linking to one of said plurality of supply sections, and separating said sealed elements of each of the complexes taken in from a supply source corresponding to the selected supply section, said complexes having a form specific to the selected supply section; and
(c) a step of aligning said separated semiconductor devices on a straight parts feeder, detecting the amount of semiconductor devices arranged on said parts feeder by means of a sensor arranged at said parts feeder, and supplying said straightly aligned semiconductor devices to a sorting section one by one by means of said parts feeder, while controlling the rate of supplying semiconductor devices from said supply section by feeding back the information obtained by said detecting operation to said supply section; and (d) a step of sorting said semiconductor devices by means of a performance test in said sorting section.

27. The semiconductor device manufacturing method according to claim 26, wherein when a semiconductor device is detected at a predetermined position on the midway of said parts feeder by said sensor in said step (c), said supply section temporarily stops to supply said separated semiconductor devices to said sorting section by feeding back the information.

* * * * *